(12) United States Patent
Hsu et al.

(10) Patent No.: US 11,908,757 B2
(45) Date of Patent: Feb. 20, 2024

(54) DIE CORNER REMOVAL FOR MOLDING COMPOUND CRACK SUPPRESSION IN SEMICONDUCTOR DIE PACKAGING AND METHODS FOR FORMING THE SAME

(71) Applicant: Taiwan Semiconductor Manufacturing Company Limited, Hsinchu (TW)

(72) Inventors: Chia-Kuei Hsu, Hsinchu (TW); Ming-Chih Yew, Hsinchu (TW); Shu-Shen Yeh, Taoyuan (TW); Po-Yao Lin, Zhudong Township (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 168 days.

(21) Appl. No.: 17/523,955

(22) Filed: Nov. 11, 2021

(65) Prior Publication Data
US 2022/0406671 A1    Dec. 22, 2022

Related U.S. Application Data

(60) Provisional application No. 63/212,490, filed on Jun. 18, 2021.

(51) Int. Cl.
H01L 23/16    (2006.01)
H01L 23/00    (2006.01)
(Continued)

(52) U.S. Cl.
CPC .......... *H01L 23/16* (2013.01); *H01L 21/561* (2013.01); *H01L 21/565* (2013.01); *H01L 23/31* (2013.01); *H01L 23/562* (2013.01)

(58) Field of Classification Search
CPC ..... H01L 23/16; H01L 21/561; H01L 21/565; H01L 23/31; H01L 23/562; H01L 24/13;
(Continued)

(56) References Cited

U.S. PATENT DOCUMENTS 8,759,147 B2 *  6/2014  Choi .................. H01L 23/3128
                                                    438/106
8,993,380 B2 *  3/2015  Hou .................... H01L 23/3135
                                                    438/112

(Continued)

*Primary Examiner* — Va A Vu
(74) *Attorney, Agent, or Firm* — The Marbury Law Group, PLLC

(57) ABSTRACT

A chip package structure includes at least one semiconductor die attached to a redistribution structure, a first underfill material portion located between the redistribution structure and the at least one semiconductor die and laterally surrounding the solder material portions, a molding compound laterally surrounding at least one semiconductor die, and a second underfill material portion contacting sidewalls of the redistribution structure and sidewalls of the molding compound and including at least one cut region. The second underfill material portion includes a vertically-extending portion having a uniform lateral width and a horizontally-extending portion having a uniform vertical thickness and adjoined to a bottom end of the vertically-extending portion within each of the at least one cut region.

20 Claims, 27 Drawing Sheets

(51) Int. Cl.
*H01L 21/56* (2006.01)
*H01L 23/31* (2006.01)

(58) Field of Classification Search
CPC ......... H01L 24/16; H01L 24/17; H01L 24/29; H01L 24/32; H01L 24/73; H01L 24/81; H01L 24/83; H01L 24/92; H01L 2224/131; H01L 2224/16145; H01L 2224/16227; H01L 2224/1703; H01L 2224/81192; H01L 23/3135; H01L 2221/68345; H01L 2224/17181; H01L 2224/2929; H01L 2224/29386; H01L 2224/32145; H01L 2224/32225; H01L 2224/73204; H01L 2224/81005; H01L 2224/83005; H01L 2224/83855; H01L 2224/92125; H01L 2224/95; H01L 2224/96; H01L 2924/15311; H01L 2924/18161; H01L 2924/3511; H01L 21/568; H01L 21/6835; H01L 25/0652; H01L 21/563; H01L 23/49838; H01L 21/78; H01L 23/293; H01L 23/3121

USPC ........................................................ 257/787
See application file for complete search history.

(56) References Cited

U.S. PATENT DOCUMENTS

| | | | |
|---|---|---|---|
| 9,000,586 B2* | 4/2015 | Do | H01L 23/5384 |
| | | | 257/737 |
| 9,524,945 B2* | 12/2016 | Hwang | H01L 24/11 |
| 9,659,907 B2* | 5/2017 | Zhai | H01L 21/561 |
| 9,666,502 B2* | 5/2017 | Chen | H01L 23/5383 |
| 9,960,328 B2* | 5/2018 | Clark | H01L 21/563 |
| 10,037,974 B2* | 7/2018 | Chang Chien | H01L 23/3672 |
| 10,170,457 B2* | 1/2019 | Chen | H01L 24/97 |
| 10,510,691 B2* | 12/2019 | Liu | H01L 23/562 |
| 11,316,249 B2* | 4/2022 | Cheng | H01L 23/66 |
| 2019/0051621 A1* | 2/2019 | Liu | H01L 21/563 |
| 2022/0367431 A1* | 11/2022 | Chen | H01L 21/568 |

* cited by examiner

DIE CORNER REMOVAL FOR MOLDING COMPOUND CRACK SUPPRESSION IN SEMICONDUCTOR DIE PACKAGING AND METHODS FOR FORMING THE SAME

RELATED APPLICATIONS

This application claims the benefit of priority from a U.S. provisional application Ser. No. 63/212,490, titled "Under Fill Fillet Removal for Improved Package Reliability and Stress Reduction," filed on Jun. 18, 2021, the entire contents of which are incorporated herein by reference.

BACKGROUND

Interfaces between a fan-out wafer level package (FOWLP) and a molding compound material portion are subjected to mechanical stress during subsequent handling of an assembly of the FOWLP, the underfill material portion, and a packaging substrate, such as attachment of the packaging substrate to a printed circuit board (PCB). In addition, interfaces between a fan-out wafer level package (FOWLP) and an underfill material portion are subjected to mechanical stress during use within a computing device, such as when the FOWLP heats up during usage and mismatch in thermal expansion of components of the FOWLP induces thermal stress or when a mobile device is accidently dropped to cause a mechanical shock during usage. Cracks may be formed in the underfill material, and may induce additional cracks in a semiconductor die, solder material portions, redistribution structures, and/or various dielectric layers within a semiconductor die or within a package substrate. Thus, formation of cracks in the underfill material needs to be suppressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
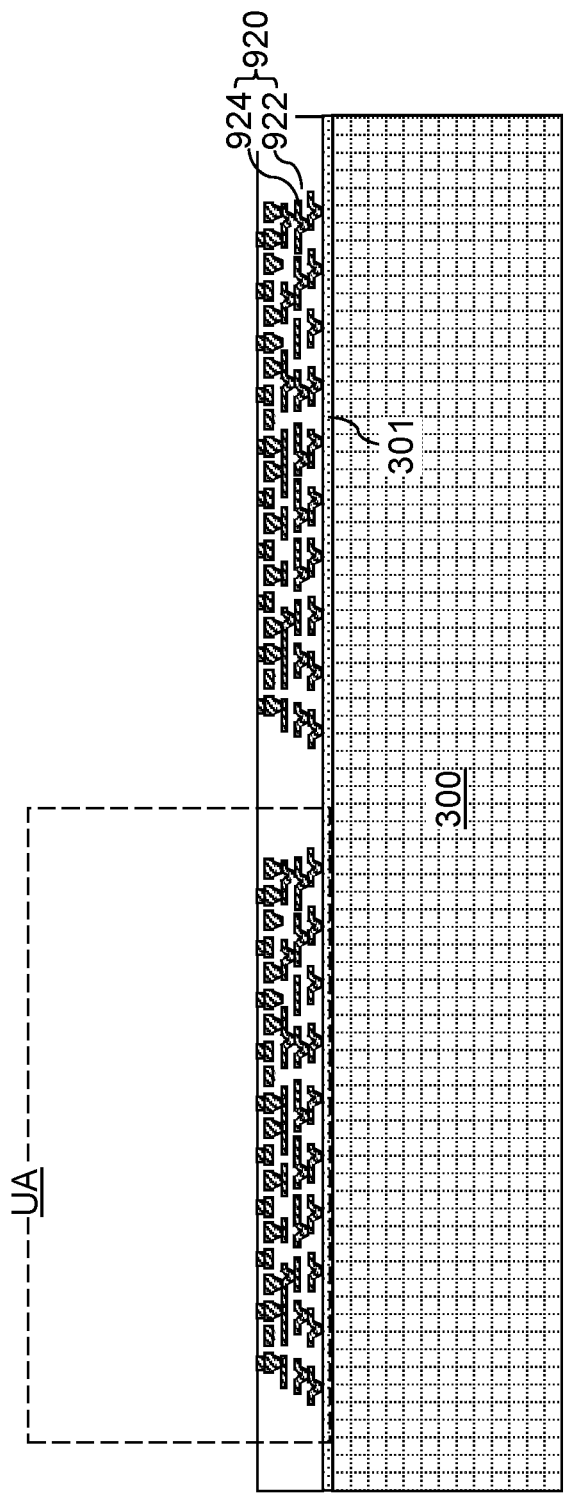
FIG. 1A is a vertical cross-sectional view of a region of an exemplary structure that includes a first carrier substrate and redistribution structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to die corner removal for underfill crack suppression in semiconductor die packaging. Generally, the methods and structures of the present disclosure may be used to provide a chip package structure such as a fan-out wafer level package (FOWLP) and fan-out panel level package (FOPLP). While the present disclosure is described using an FOWLP configuration, the methods and structures of the present disclosure may be implemented in an FOPLP configuration or any other fan-out package configuration. The various embodiment chip package structures may have enhanced resistance to crack generation in an underfill material portion that laterally surrounds the fan-out package.

Typically, heterogeneous integration is used to integrate a large interposer (such as a CoWoS interposer or an organic interposer) and a high electrical performance substrate (such as a multi-layer core or a multilayer substrate (which may include 12 or more layers) for a high performance chip. The effective coefficient of thermal expansion for such a structure may be more than four time the coefficient of thermal expansion for silicon. Such a large mismatch of coefficients of thermal expansion between a substrate and semiconductor dies on an interposer results in molding crack at fan-out module corners. For these reasons, large fan-out modules formed by molding have high crack risk at the corners.

According to an aspect of the present disclosure, at least one fillet of an underfill material may be removed from peripheral regions of an underfill material portion by performing a corner cut process. The cut corners may reduce the mechanical coupling between the underfill material portion and a substrate (such as a redistribution structure) to which at least one semiconductor die is attached. Molding stress may be reduced through formation of cut corners in various chip packaging configurations such as a Chip-on-Wafer (CoW) configuration. Thus, an embodiment fan-out package of the present disclosure may be more resistant to crack generation and/or crack propagation under thermal stress. The various aspects and embodiments of the methods and structures of the present disclosure are now described with reference to accompanying drawings. The various disclosed embodiments provide a structure that may improve the reliability and reduce the stress on the molding and improve overall package reliability. The various aspects and embodiments of the methods and structures of the present disclosure are now described with reference to accompanying drawings.

Figure 1B:
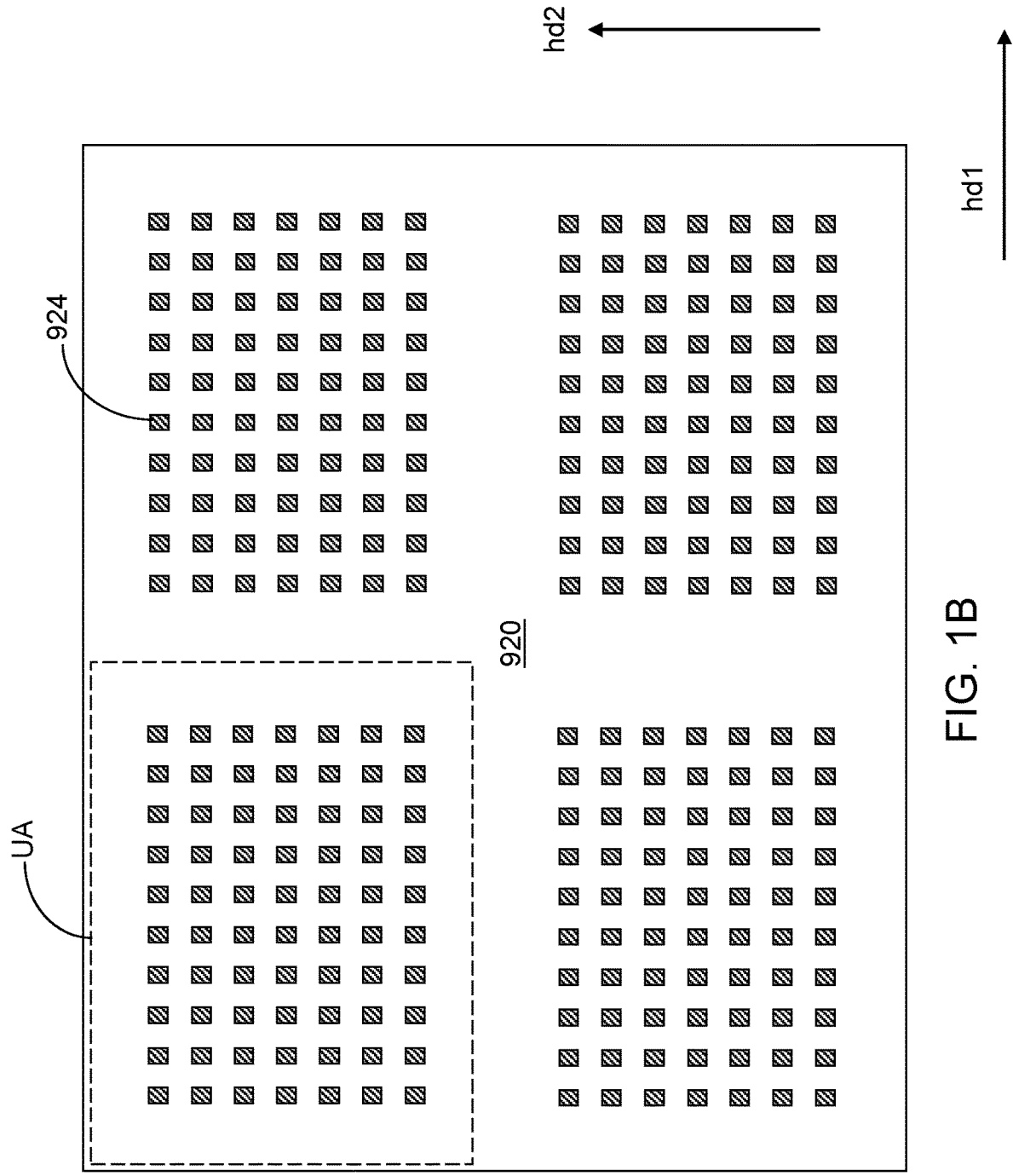
FIG. 1B is a top-down view of the exemplary structure of FIG. 1A.

Referring to FIGS. 1A and 1B, an exemplary structure according to an embodiment of the present disclosure includes a first carrier substrate 300 and redistribution structures 920 formed on a front side surface of the first carrier substrate 300. The first carrier substrate 300 may include an optically transparent substrate such as a glass substrate or a sapphire substrate. The diameter of the first carrier substrate 300 may be in a range from 150 mm to 290 mm, although lesser and greater diameters may be used. In addition, the thickness of the first carrier substrate 300 may be in a range from 500 microns to 2,000 microns, although lesser and greater thicknesses may also be used. Alternatively, the first carrier substrate 300 may be provided in a rectangular panel format.

A first adhesive layer 301 may be applied to the front-side surface of the first carrier substrate 300. In one embodiment, the first adhesive layer 301 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. For example, the LTHC layer may include Light-To-Heat Conversion Release Coating (LTHC) Ink™ that is commercially available from The 3M Company®. Alternatively, the first adhesive layer 301 may include a thermally decomposing adhesive material. For example, the first adhesive layer 301 may include an acrylic pressure-sensitive adhesive that decomposes at an elevated temperature. The debonding temperature of the thermally decomposing adhesive material may be in a range from 150 degrees to 200 degrees Celsius.

Redistribution structures 920 may be formed over the first adhesive layer 301. Specifically, a redistribution structure 920 may be formed within each unit area UA, which is the area of a repetition unit that is repeated in a two-dimensional array over the first carrier substrate 300. Each redistribution structure 920 may include redistribution dielectric layers 922 and redistribution wiring interconnects 924. The redistribution dielectric layers 922 include a respective dielectric polymer material such as polyimide (PI), benzocyclobutene (BCB), or polybenzobisoxazole (PBO). Other suitable materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 400 nm, and the copper seed layer may have a thickness in a range from 100 nm to 500 nm. The metallic fill material for the redistribution wiring interconnects 924 may include copper, nickel, or copper and nickel. Other suitable metallic fill materials are within the contemplated scope of disclosure. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each redistribution structure 920 (i.e., the levels of the redistribution wiring interconnects 924) may be in a range from 1 to 10. A periodic two-dimensional array (such as a rectangular array) of redistribution structures 920 may be formed over the first carrier substrate 300. Each redistribution structure 920 may be formed within a unit area UA, which is a unit of repetition for a two-dimensional array of redistribution structures 920. The layer including all redistribution structures 920 is herein referred to as a redistribution structure layer. The redistribution structure layer includes a two-dimensional array of redistribution structures 920. In one embodiment, the two-dimensional array of redistribution structures 920 may be a rectangular periodic two-dimensional array of redistribution structures 920 having a first periodicity along a first horizontal direction hd1 and having a second periodicity along a second horizontal direction hd2 that is perpendicular to the first horizontal direction hd1. In some embodiments, the redistribution wiring interconnects 924 may include alternately stacked wiring portions and via structures.

Figure 2A:
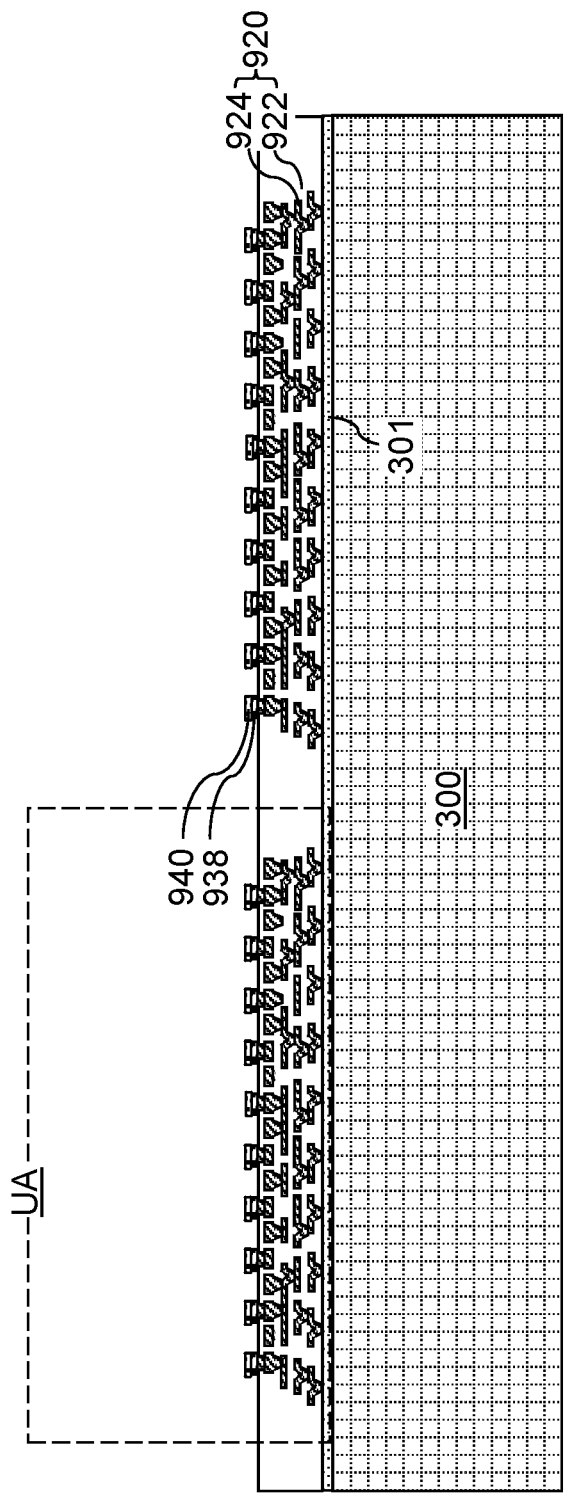
FIG. 2A is vertical cross-sectional view of a region of the exemplary structure after formation of redistribution-side metal pad structures and first solder material portions according to an embodiment of the present disclosure.
Figure 2B:
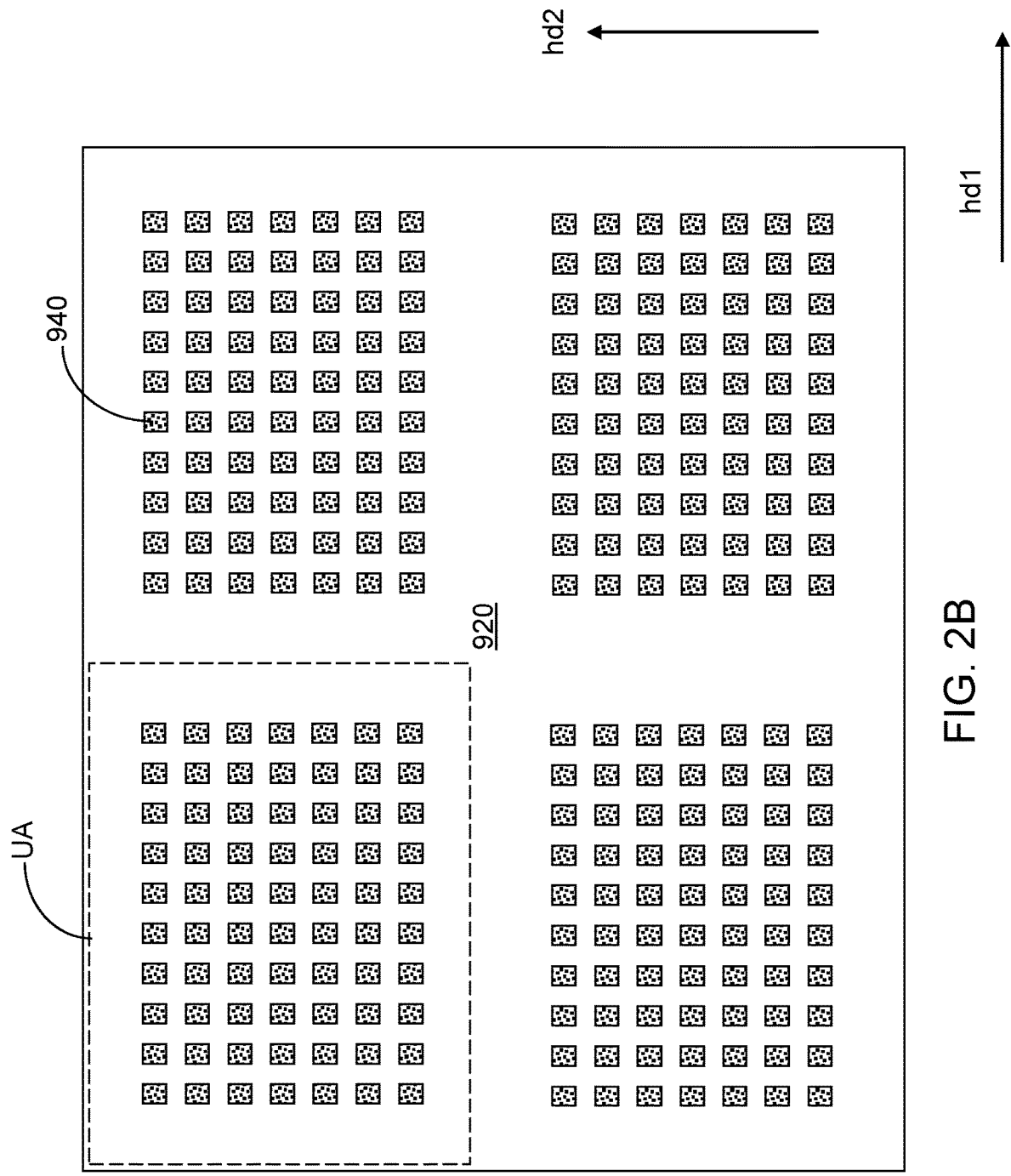
FIG. 2B is a top-down view of the region of the exemplary structure of FIG. 2A.

Referring to FIGS. 2A and 2B, at least one metallic material and a first material may be sequentially deposited over the front-side surface of the redistribution structures 920. The at least one metallic material comprises a material that may be used for metallic pads, such as copper. The thickness of the at least one metallic material may be in a range from 5 microns to 60 microns, such as from 10 microns to 30 microns, although lesser and greater thicknesses may also be used. The first material may comprise a first material suitable for C2 bonding, i.e., for microbump bonding. The thickness of the first material may be in a range from 2 microns to 30 microns, such as from 4 microns to 15 microns, although lesser and greater thicknesses may also be used.

The first material and the at least one metallic material may be patterned into discrete arrays of first solder material portions 940 and arrays of metal pad structures, which are herein referred to as arrays of redistribution-side metal pad structures 938. Each array of redistribution-side metal pad structures 938 is formed within a respective unit area UA. Each array of first solder material portions 940 is formed within a respective unit area UA. Each first solder material portion 940 may have a same horizontal cross-sectional shape as an underlying redistribution-side metal pad structures 938.

In one embodiment, the redistribution-side metal pad structures 938 may include, and/or may consist essentially of, copper or a copper-containing alloy. Other suitable materials are within the contemplated scope of disclosure. The thickness of the redistribution-side metal pad structures 938 may be in a range from 5 microns to 60 microns, although lesser or greater thicknesses may also be used. The redistribution-side metal pad structures 938 may have horizontal cross-sectional shapes of rectangles, rounded rectangles, circles, regular polygons, irregular polygons, or any other two-dimensional curvilinear shape having a closed periphery. In one embodiment, redistribution-side metal pad structures 938 may be configured for microbump bonding (i.e., C2 bonding), and may have a thickness in a range from 10 microns to 30 microns, although lesser or greater thicknesses may also be used. In this embodiment, each array of redistribution-side metal pad structures 938, such as copper pillars or under bump metallurgies (UBM), may be portions of an array of microbumps having a lateral dimension in a range from 10 microns to 25 microns, and having a pitch in a range from 20 microns to 50 microns.

Figure 3A:
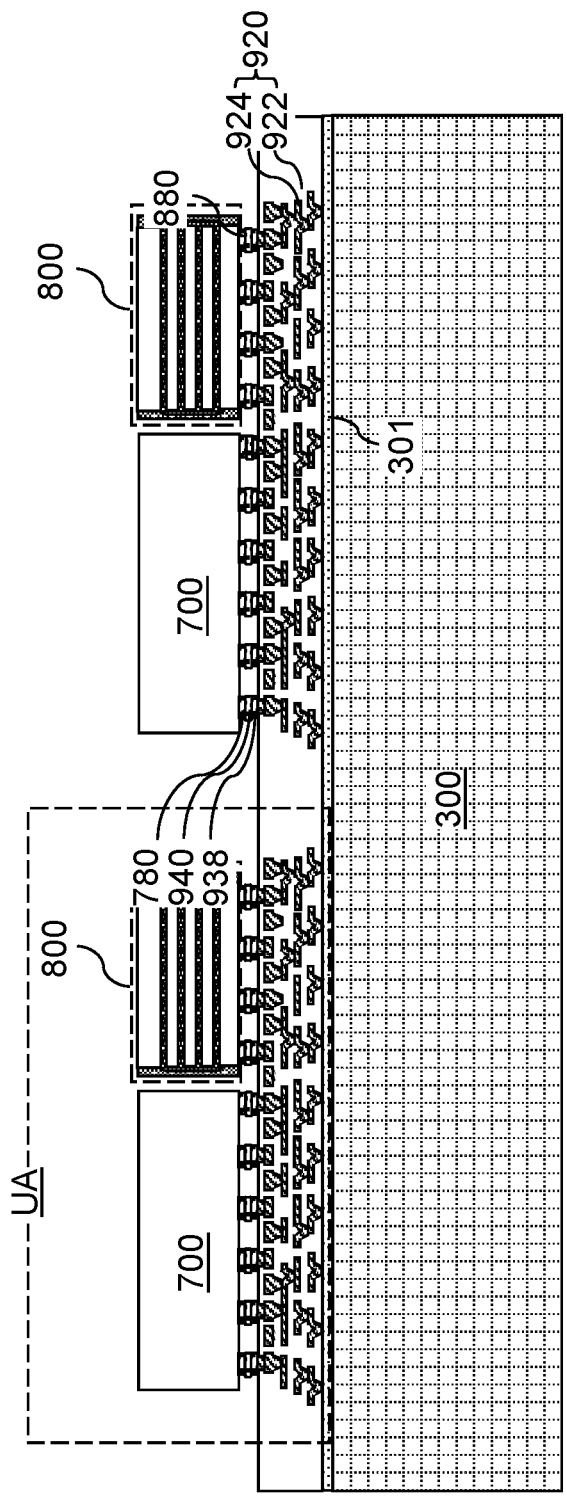
FIG. 3A is a vertical cross-sectional view of a region the exemplary structure after attaching semiconductor dies according to an embodiment of the present disclosure.
Figure 3B:
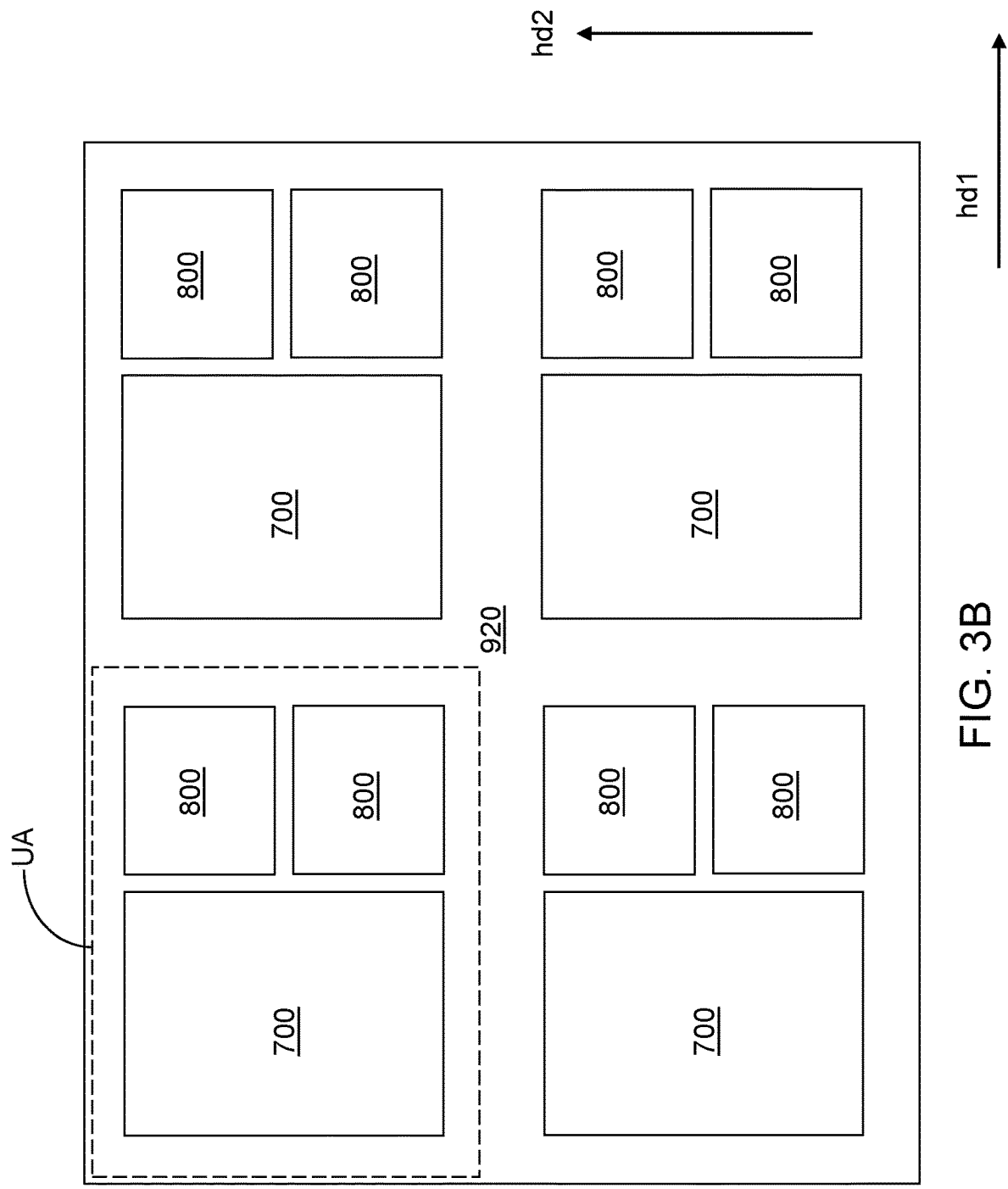
FIG. 3B is a top-down view of the region of the exemplary structure of FIG. 3A.

Referring to FIGS. 3A and 3B, a set of at least one semiconductor die (700, 800) may be bonded to each redistribution structure 920. In one embodiment, the redistribution structures 920 may be arranged as a two-dimensional periodic array, and multiple sets of at least one semiconductor die (700, 800) may be bonded to the redistribution structures 920 as a two-dimensional periodic rectangular array of sets of the at least one semiconductor die (700, 800). Each set of at least one semiconductor die (700, 800) includes at least one semiconductor die. Each set of at least one semiconductor die (700, 800) may include any set of at least one semiconductor die known in the art. In one embodiment, each set of at least one semiconductor die (700, 800) may comprise a plurality of semiconductor dies (700, 800). For example, each set of at least one semiconductor die (700, 800) may include at least one system-on-chip (SoC) die 700 and/or at least one memory die 800. Each SoC die 700 may comprise an application processor die, a central processing unit die, or a graphic processing unit die. In one embodiment, the at least one memory die 800 may comprise a high bandwidth memory (HBM) die that includes a vertical stack of static random access memory dies. In one embodiment, the at least one semiconductor die (700, 800) may include at least one system-on-chip (SoC) die and a high bandwidth memory (HBM) die including a vertical stack of static random access memory (SRAM) dies that are interconnected to one another through microbumps and are laterally surrounded by an epoxy molding material enclosure frame.

Figure 3C:
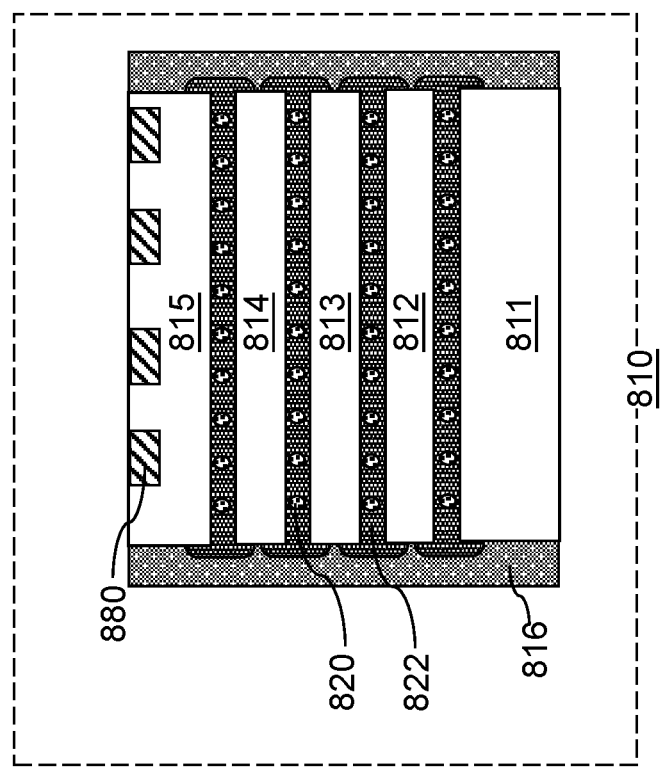
FIG. 3C is a magnified vertical cross-sectional view of a high bandwidth memory die.

Referring to FIGS. 3A and 3C, each semiconductor die (700, 800) may comprise a respective array of die-side metal pad structures (780, 880). For example, each SoC die 700 may comprise an array of SoC metal pad structures 780, and each memory die 800 may comprise an array of memory-die metal pad structures 880. Each of the semiconductor dies (700, 800) may be positioned in a face-down position such that die-side metal pad structures (780, 880) face the first solder material portions 940. Each set of at least one semiconductor die (700, 800) may be placed within a respective unit area UA. Placement of the semiconductor dies (700, 800) may be performed using a pick and place apparatus so that each of the die-side metal pad structures (780, 880) is placed on a top surface of a respective one of the first solder material portions 940.

Generally, a redistribution structure 920 including redistribution-side metal pad structures 938 thereupon may be provided, and at least one semiconductor die (700, 800) including a respective set of die-side metal pad structures (780, 880) may be provided. The at least one semiconductor die (700, 800) may be bonded to the redistribution structure 920 using first solder material portions 940 that are bonded to a respective redistribution-side metal pad structure 938 and to a respective one of the die-side metal pad structures (780, 880). Generally, a first array of metallic joint structures can be formed. Each metallic joint structure may comprise a first metal pad structure (such as a redistribution-side metal pad structure 938), a second metal pad structure (such as a die-side metal pad structure (780, 880)), and a bump material portion (such as a first solder material portion 940).

Referring to FIG. 3C, a high bandwidth memory (HBM) die 810 is illustrated, which may be used as a memory die 800 within the exemplary structures of FIGS. 4A and 4B. The HBM die 810 includes a vertical stack of static random access memory dies (811, 812, 813, 814, 815) that are interconnected to one another through microbumps 820 and are laterally surrounded by an epoxy molding material enclosure frame 816. The gaps between vertically neighboring pairs of the random access memory dies (811, 812, 813, 814, 815) may be filled with a HBM underfill material portions 822 that laterally surrounds a respective set of microbumps 820. The HBM die 810 may comprise an array of memory-die metal pad structures 880 configured to be bonded to a subset of an array of redistribution-side metal pad structures 938 within a unit area UA. The HBM die 810 may be configured to provide a high bandwidth as defined under JEDEC standards, i.e., standards defined by The JEDEC Solid State Technology Association.

Figure 4:
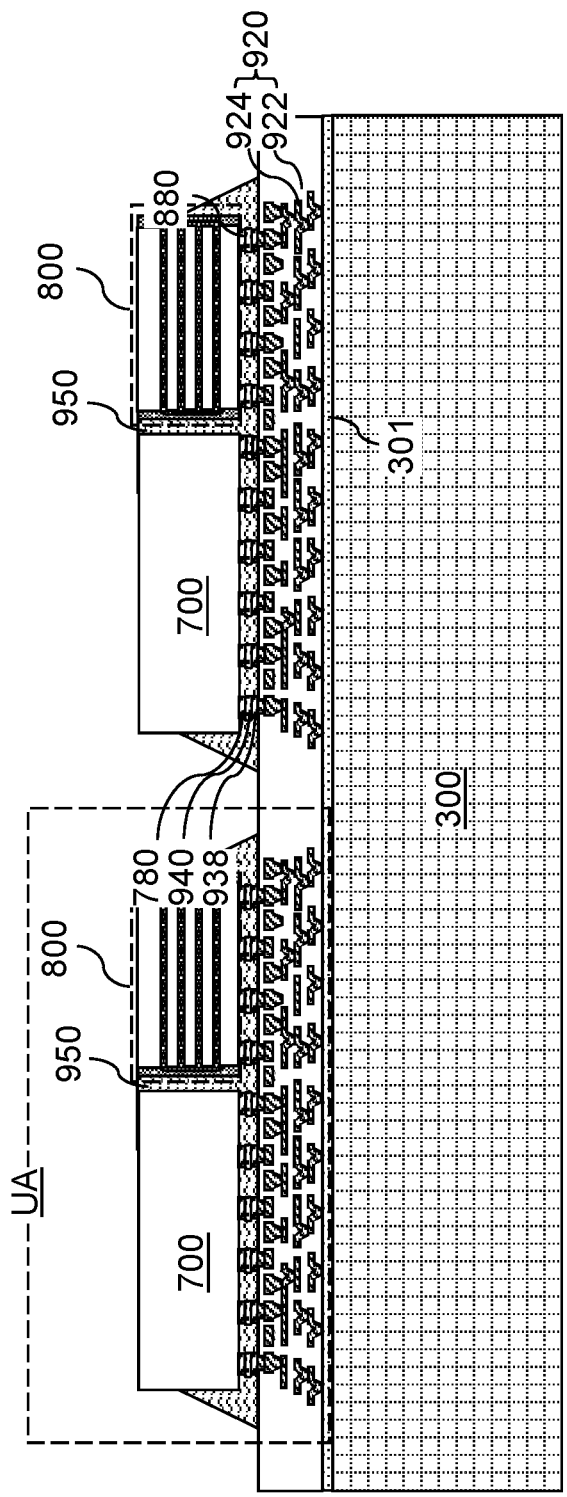
FIG. 4 is a vertical cross-sectional view of a region of the exemplary structure after formation of first underfill material portions.

Referring to FIG. 4, a first underfill material may be applied into each gap between the redistribution structures 920 and sets of at least one semiconductor die (700, 800) that are bonded to the redistribution structures 920. The first underfill material may comprise any underfill material known in the art. A first underfill material portion 950 may be formed within each unit area UA between a redistribution structure 920 and an overlying set of at least one semiconductor die (700, 800). The first underfill material portions 950 may be formed by injecting the first underfill material around a respective array of first solder material portions 940 in a respective unit area UA. Any known underfill material application method may be used, which may be, for example, the capillary underfill method, the molded underfill method, or the printed underfill method.

Within each unit area UA, a first underfill material portion 950 may laterally surround, and contact, each of the first solder material portions 940 within the unit area UA. The first underfill material portion 950 may be formed around, and contact, the first solder material portions 940, the redistribution-side metal pad structures 938, and the die-side metal pad structures (780, 880) in the unit area UA.

Each redistribution structure 920 in a unit area UA comprises redistribution-side metal pad structures 938. At least one semiconductor die (700, 800) comprising a respective set of die-side metal pad structures (780, 880) is attached to the redistribution-side metal pad structures 938 through a respective set of first solder material portions 940 within each unit area UA. Within each unit area UA, a first underfill material portion 950 laterally surrounds the redistribution-side metal pad structures 938 and the die-side metal pad structures (780, 880) of the at least one semiconductor die (700, 800).

Figure 5A:
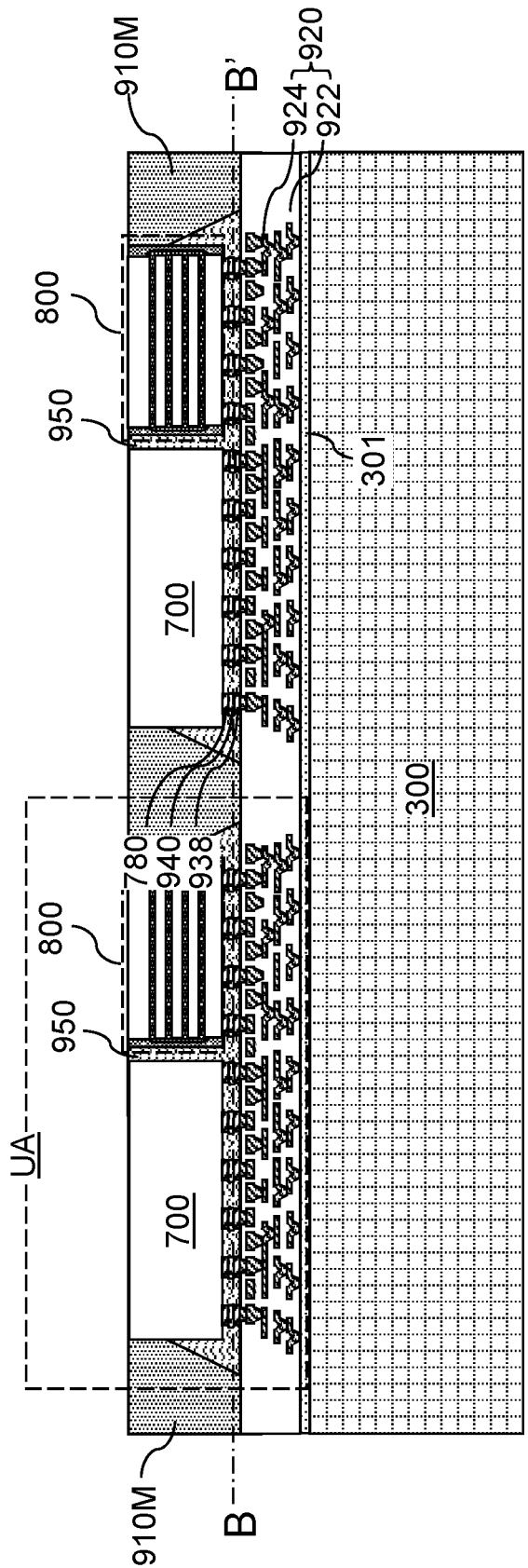
FIG. 5A is a vertical cross-sectional view of a region of the exemplary structure after formation of an epoxy molding compound (EMC) matrix according to an embodiment of the present disclosure.
Figure 5B:
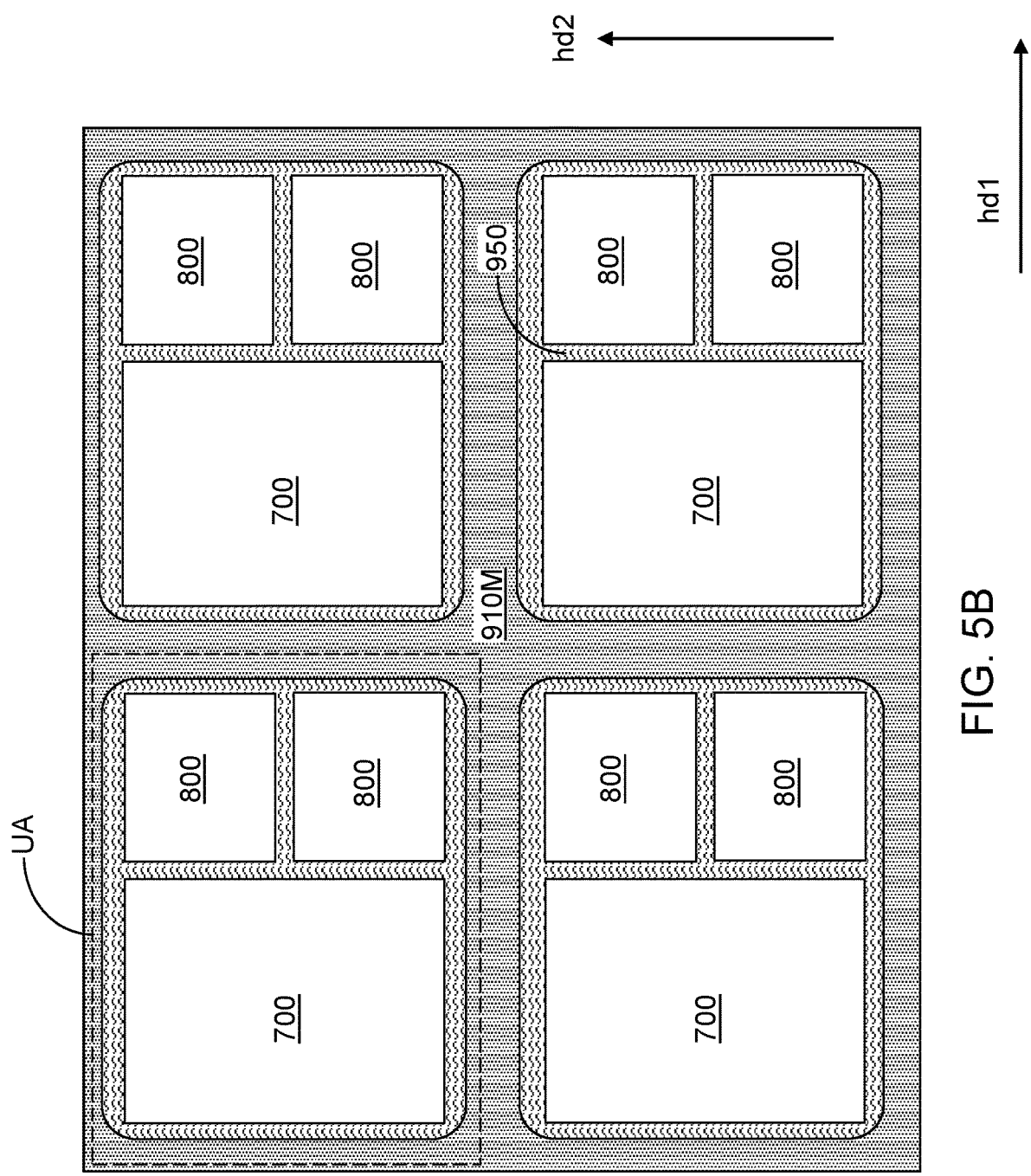
FIG. 5B is a top-down view of the region of the exemplary structure of FIG. 5A.

Referring to FIGS. 5A and 5B, an epoxy molding compound (EMC) may be applied to the gaps between contiguous assemblies of a respective set of semiconductor dies (700, 800) and a first underfill material portion 950.

The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the first adhesive layer 301 if the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each assembly of a set of semiconductor dies (700, 800) and a first underfill material portion 950. The EMC matrix 910M includes a plurality of epoxy molding compound (EMC) die frames that may be laterally adjoined to one another. Each EMC die frame is a portion of the EMC matrix 910M that is located within a respective unit area UA. Thus, each EMC die frame laterally surrounds and embeds a respective a set of semiconductor dies (700, 800) and a respective first underfill material portion 950. Young's modulus of pure epoxy is about 3.35 GPa, and Young's modulus of the EMC may be higher than Young's modulus of pure epoxy by adding additives. Young's modules of EMC may be greater than 3.5 GPa.

Portions of the EMC matrix 910M that overlies the horizontal plane including the top surfaces of the semiconductor dies (700, 800) may be removed by a planarization process. For example, the portions of the EMC matrix 910M that overlies the horizontal plane may be removed using a chemical mechanical planarization. The combination of the remaining portion of the EMC matrix 910M, the semiconductor dies (700, 800), the first underfill material portions 950, and the two-dimensional array of redistribution structures 920 comprises a reconstituted wafer 900W. Each portion of the EMC matrix 910M located within a unit area UA constitutes an EMC die frame.

Figure 6:
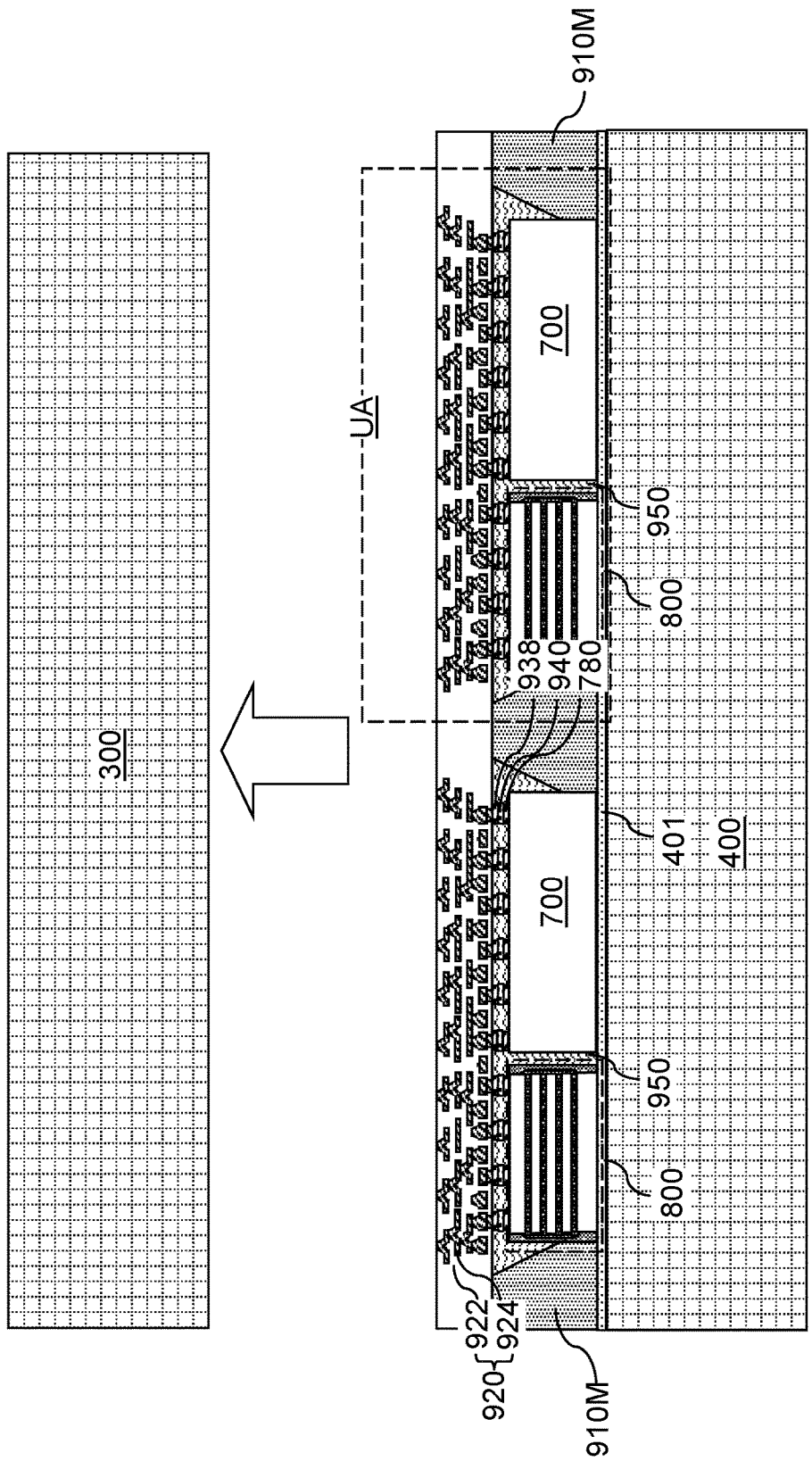
FIG. 6 is a vertical cross-sectional view of a region of the exemplary structure after attaching a second carrier substrate and detaching the first carrier substrate according to an embodiment of the present disclosure.

Referring to FIG. 6, a second adhesive layer 401 may be applied to the physically exposed planar surface of the reconstituted wafer 900W, i.e., the physically exposed surfaces of the EMC matrix 910M, the semiconductor dies (700, 800), and the first underfill material portions 950. In one embodiment, the second adhesive layer 401 may comprise a same material as, or may comprise a different material from, the material of the first adhesive layer 301. If the first adhesive layer 301 comprises a thermally decomposing adhesive material, the second adhesive layer 401 comprises another thermally decomposing adhesive material that decomposes at a higher temperature, or may comprise a light-to-heat conversion material.

A second carrier substrate 400 may be attached to the second adhesive layer 401. The second carrier substrate 400 may be attached to the opposite side of the reconstituted wafer 900W relative to the first carrier substrate 300. Generally, the second carrier substrate 400 may comprise any material that may be used for the first carrier substrate 300. The thickness of the second carrier substrate 400 may be in a range from 500 microns to 2,000 microns, although lesser and greater thicknesses may also be used.

The first adhesive layer 301 may be decomposed by ultraviolet radiation or by a thermal anneal at a debonding temperature. In embodiments in which the first carrier substrate 300 includes an optically transparent material and the first adhesive layer 301 includes an LTHC layer, the first adhesive layer 301 may be decomposed by irradiating ultraviolet light through the transparent carrier substrate. The LTHC layer may be absorb the ultraviolet radiation and generate heat, which decomposes the material of the LTHC layer and cause the transparent first carrier substrate 300 to be detached from the reconstituted wafer 900W. In embodiments in which the first adhesive layer 301 includes a thermally decomposing adhesive material, a thermal anneal process at a debonding temperature may be performed to detach the first carrier substrate 300 from the reconstituted wafer 900W.

Figure 7:
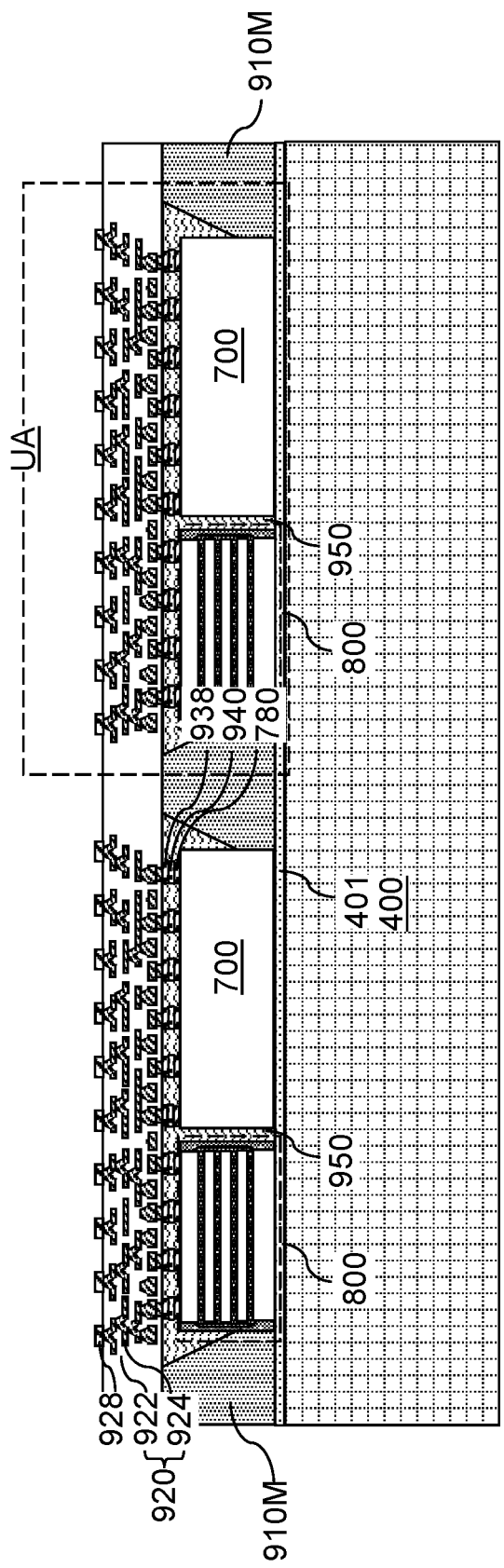
FIG. 7 is a vertical cross-sectional view of a region of the exemplary structure after formation of fan-out bonding pads according to an embodiment of the present disclosure.

Referring to FIG. 7, fan-out bonding pads 928 may be formed by depositing and patterning at least one metallic material that may function as bonding pads. The metallic fill material for the fan-out bonding pads 928 may include copper. Other suitable materials are within the contemplated scope of disclosure. The thickness of the fan-out bonding pads 928 may be in a range from 5 microns to 100 microns, although lesser or greater thicknesses may also be used. The fan-out bonding pads 928 may have horizontal cross-sectional shapes of rectangles, rounded rectangles, or circles. Other suitable shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of micropads (such as copper pillars or UBMs) having a lateral dimension in a range from 10 microns to 25 microns, and having a pitch in a range from 20 microns to 50 microns.

The fan-out bonding pads 928 may be formed on the opposite side of the EMC matrix 910M and the two-dimensional array of sets of semiconductor dies (700, 800) relative to the redistribution structure layer. The redistribution structure layer includes a two-dimensional array of redistribution structures 920. Each redistribution structure 920 may be located within a respective unit area UA. Each redistribution structure 920 may comprise redistribution dielectric layers 922, redistribution wiring interconnects 924 embedded in the redistribution dielectric layers 922, and fan-out bonding pads 928. The fan-out bonding pads 928 may be located on an opposite side of the redistribution-side metal pad structures 938 relative to the redistribution dielectric layers 922, and are electrically connected to a respective one of the redistribution-side metal pad structures 938.

Figure 8:
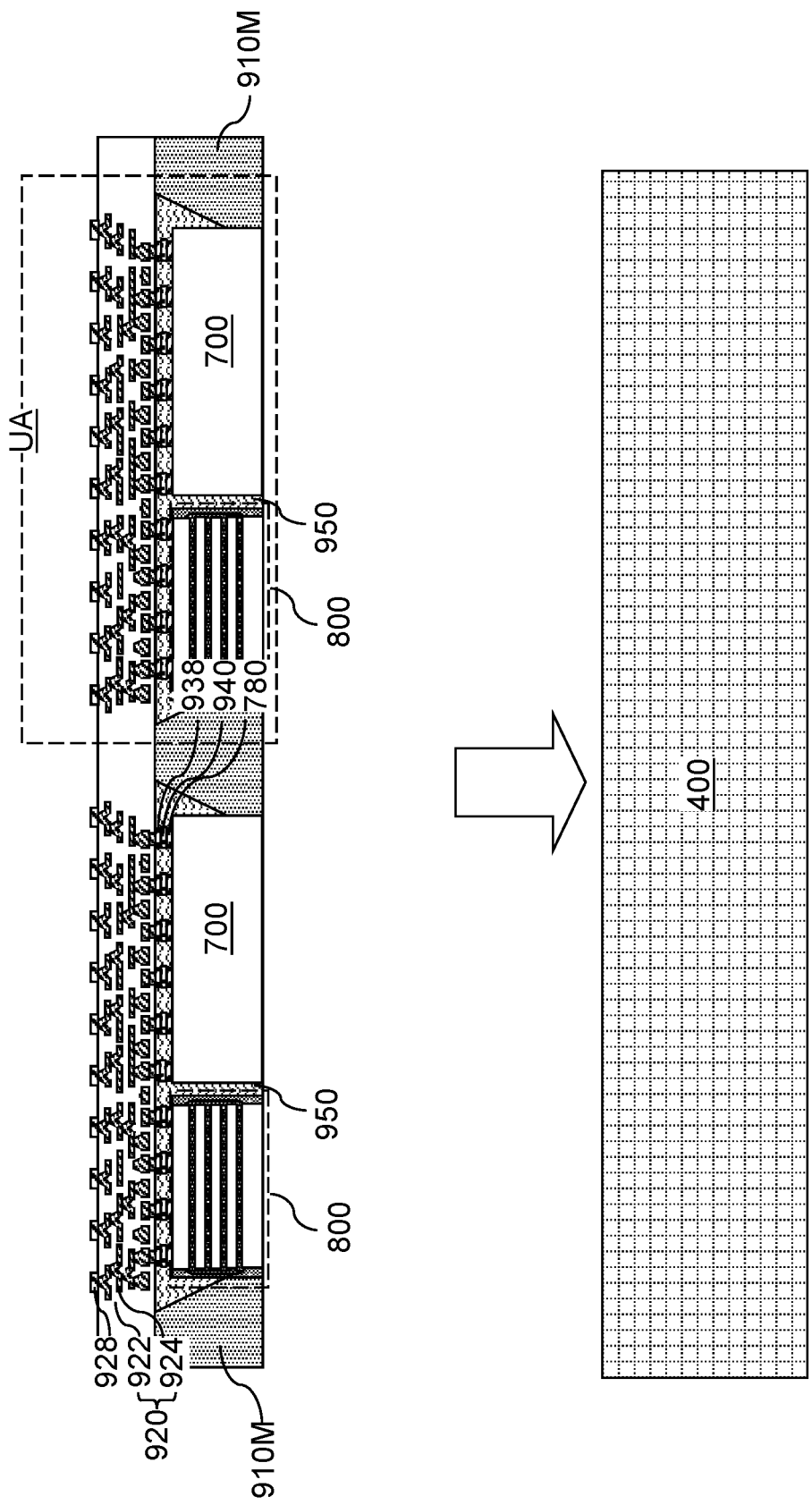
FIG. 8 is a vertical cross-sectional view of a region of the exemplary structure after detaching the second carrier substrate according to an embodiment of the present disclosure.

Referring to FIG. 8, the second adhesive layer 401 may be decomposed by ultraviolet radiation or by a thermal anneal at a debonding temperature. In embodiments in which the second carrier substrate 400 includes an optically transparent material and the second adhesive layer 401 includes an LTHC layer, the second adhesive layer 401 may be decomposed by irradiating ultraviolet light through the transparent carrier substrate. In embodiments in which the second adhesive layer 401 includes a thermally decomposing adhesive material, a thermal anneal process at a debonding temperature may be performed to detach the second carrier substrate 400 from the reconstituted wafer 900W.

Figure 9:
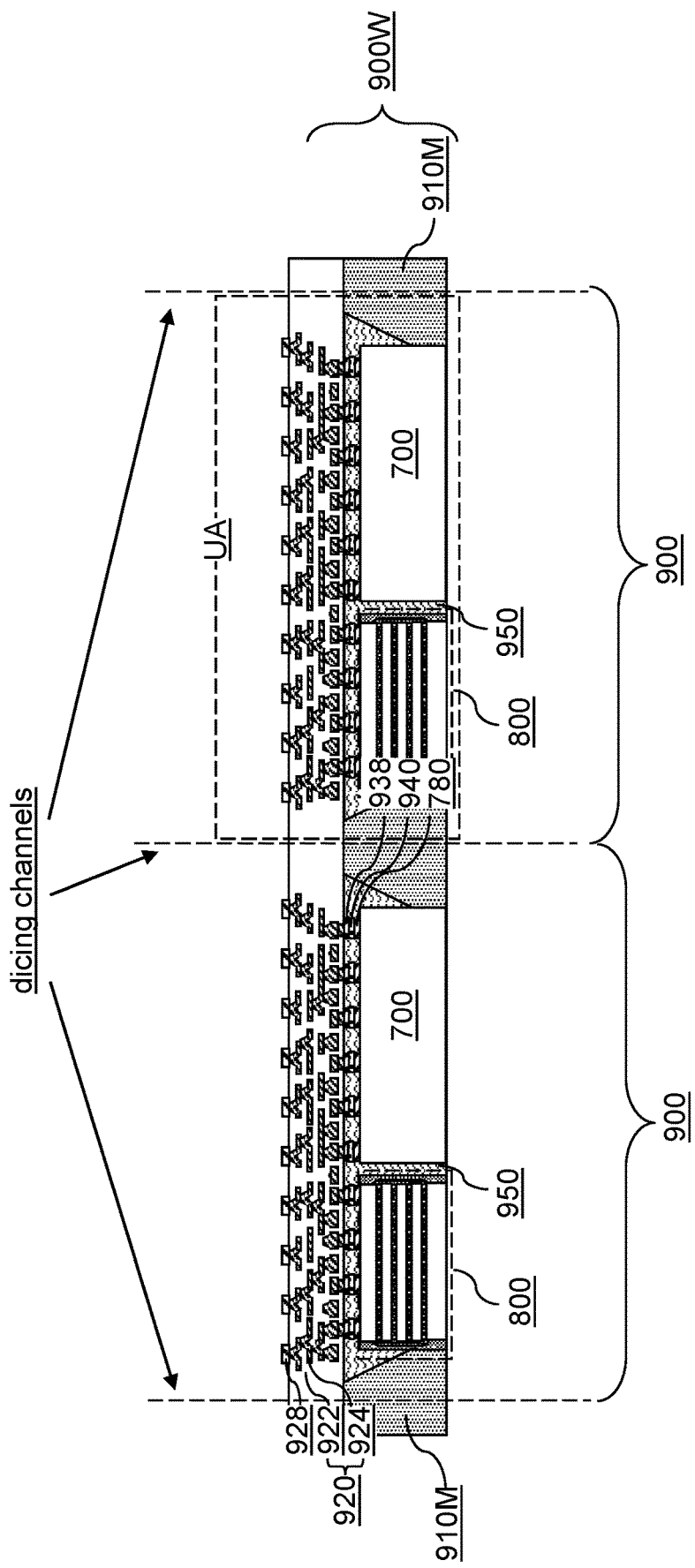
FIG. 9 is a vertical cross-sectional view of a region of the exemplary structure during dicing of a redistribution substrate and the EMC matrix according to an embodiment of the present disclosure.

Referring to FIG. 9, the reconstituted wafer 900W including the fan-out bonding pads 928 may be subsequently diced along dicing channels by performing a dicing process. The dicing channels correspond to the boundaries between neighboring pairs of die areas DA. Each diced unit from the reconstituted wafer 900W comprises a fan-out package 900. In other words, each diced portion of the assembly of the two-dimensional array of sets of semiconductor dies (700, 800), the two-dimensional array of first underfill material portions 950, the EMC matrix 910M, and the two-dimensional array of redistribution structures 920 constitutes a fan-out package 900. Each diced portion of the EMC matrix 910M constitutes a molding compound die frame 910. Each diced portion of the redistribution structure layer (which includes the two-dimensional array of redistribution structures 920) constitutes a redistribution structure 920.

Figure 10A:
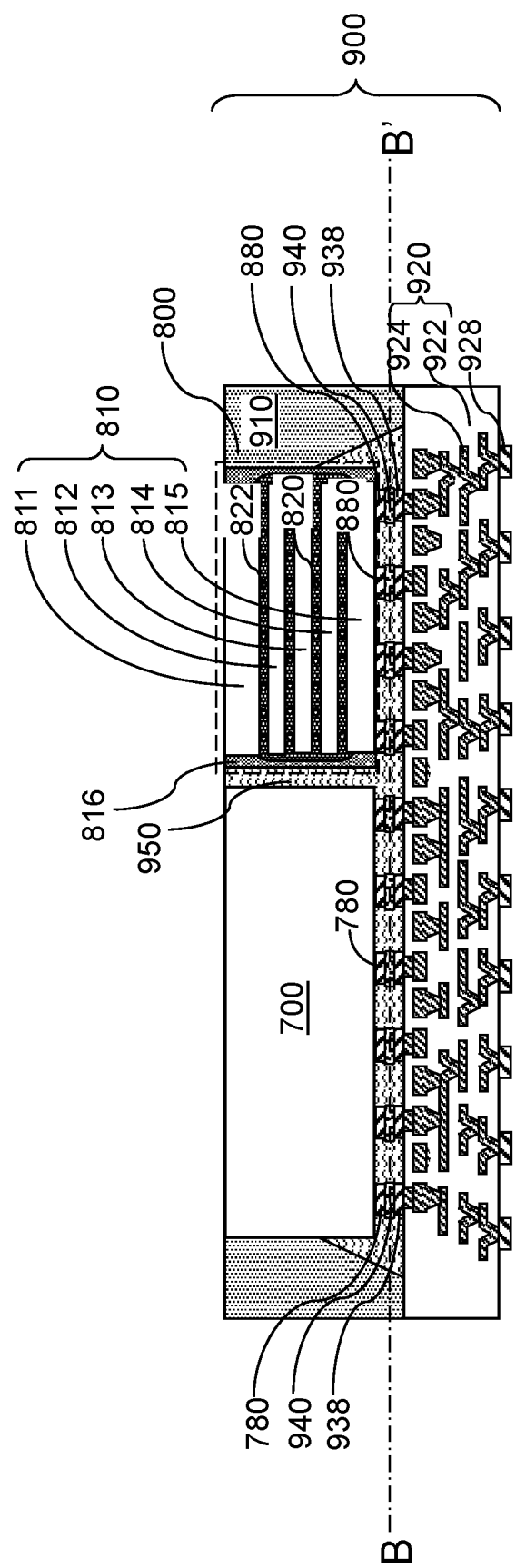
FIG. 10A is a vertical cross-sectional view of a fan-out package according to an embodiment of the present disclosure.
Figure 10B:
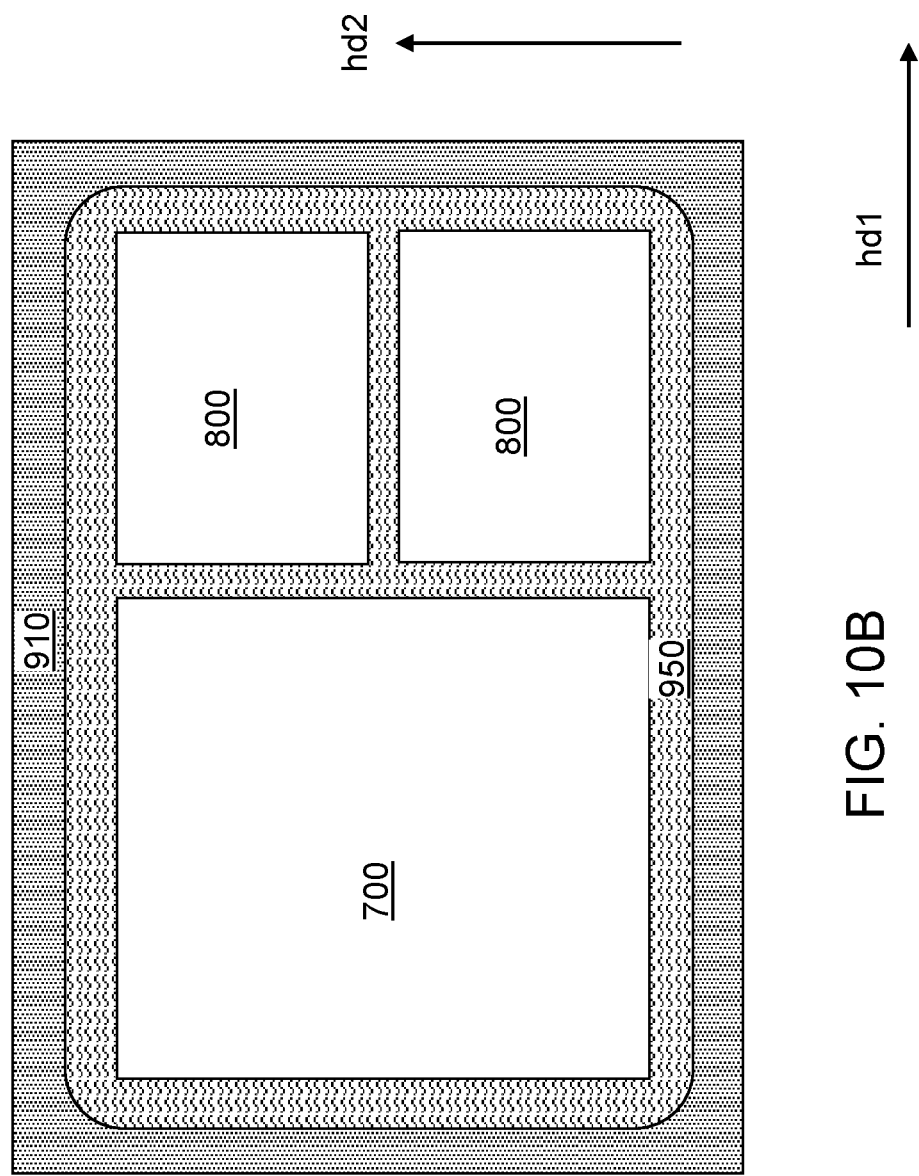
FIG. 10B is a horizontal cross-sectional view of the fan-out package along the horizontal plane B-B' of FIG. 10A.

Referring to FIGS. 10A and 10B, a fan-out package 900 obtained by dicing the exemplary structure at the processing steps of FIG. 9 is illustrated. The fan-out package 900 comprises a redistribution structure 920 including redistribution-side metal pad structures 938, at least one semiconductor die (700, 800) comprising a respective set of die-side metal pad structures (780, 880) that is attached to the redistribution-side metal pad structures 938 through a respective set of first solder material portions 940, a first underfill material portion 950 laterally surrounding the redistribution-side metal pad structures 938 and the die-side metal pad structures (780, 880) of the at least one semiconductor die (700, 800).

The fan-out package 900 may comprise a molding compound die frame 910 laterally surrounding the at least one semiconductor die (700, 800) and comprising a molding compound material. In one embodiment, the molding compound die frame 910 comprises sidewalls that are vertically coincident with sidewalls of the redistribution structure 920, i.e., located within same vertical planes as the sidewalls of the redistribution structure 920. Generally, the molding compound die frame 910 may be formed around the at least one semiconductor die (700, 800) after formation of the first underfill material portion 950 within each fan-out package 900. The molding compound material contacts a peripheral portion of a planar surface of the redistribution structure 920.

Figure 11:
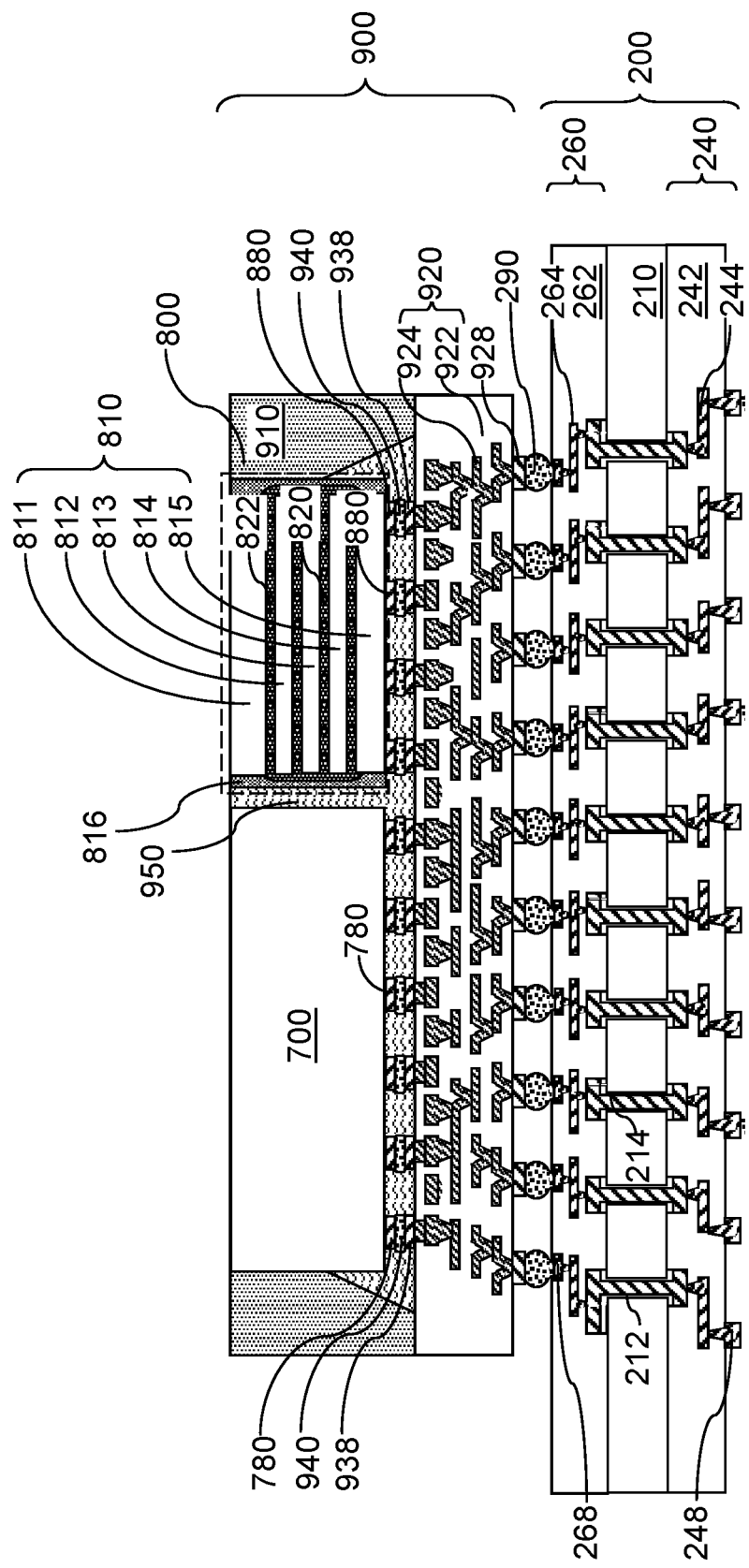
FIG. 11 is a vertical cross-sectional view of an exemplary structure after attaching the fan-out package to a package substrate according to an embodiment of the present disclosure.

Referring to FIG. 11, second solder material portions 290 may be attached to the fan-out bonding pads 928. A package substrate 200 may be bonded to the fan-out package 900 through the second solder material portions 290. The package substrate 200 may be a cored package substrate including a core substrate 210, or a coreless package substrate that does not include a package core. Alternatively, the package substrate 200 may include a system-on-integrated package substrate (SoIS) including redistribution layers and/or dielectric interlayers, at least one embedded interposer (such as a silicon interposer). Such a system-integrated package substrate may include layer-to-layer interconnections using bonding material portions, underfill material portions (such as molded underfill material portions), and/or an optional adhesion film (not shown). While the present disclosure is described using an exemplary substrate package, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the package substrate 200 includes a chip-side surface laminar circuit 260 comprising chip-side wiring interconnects 264 connected to an array of chip-side bonding pads 268 that may be bonded to the array of second solder material portions 290, and a board-side surface laminar circuit 240 including board-side wiring interconnects 244 connected to an array of board-side bonding pads 248. The array of board-side bonding pads 248 may be configured to allow bonding through solder balls. The array of chip-side bonding pads 268 may be configured to allow bonding through C4 solder balls. Generally, any type of package substrate 200 may be used. While the present disclosure is described using an embodiment in which the package substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

The second solder material portions 290 attached to the fan-out bonding pads 928 of the fan-out package 900 may be disposed on the array of the chip-side bonding pads 268 of the package substrate 200. A reflow process may be performed to reflow the second solder material portions 290, thereby inducing bonding between the fan-out package 900 and the package substrate 200. In one embodiment, the second solder material portions 290 may include C4 solder balls, and the fan-out package 900 may be attached to the package substrate 200 using an array of C4 solder balls. Generally, a second array of metallic joint structures can be formed. Each metallic joint structure may comprise a first metal pad structure (such as a chip-side bonding pad 268), a second metal pad structure (such as a fan-out bonding pad 928), and a bump material portion (such as a second solder material portion 290).

Figure 12A:
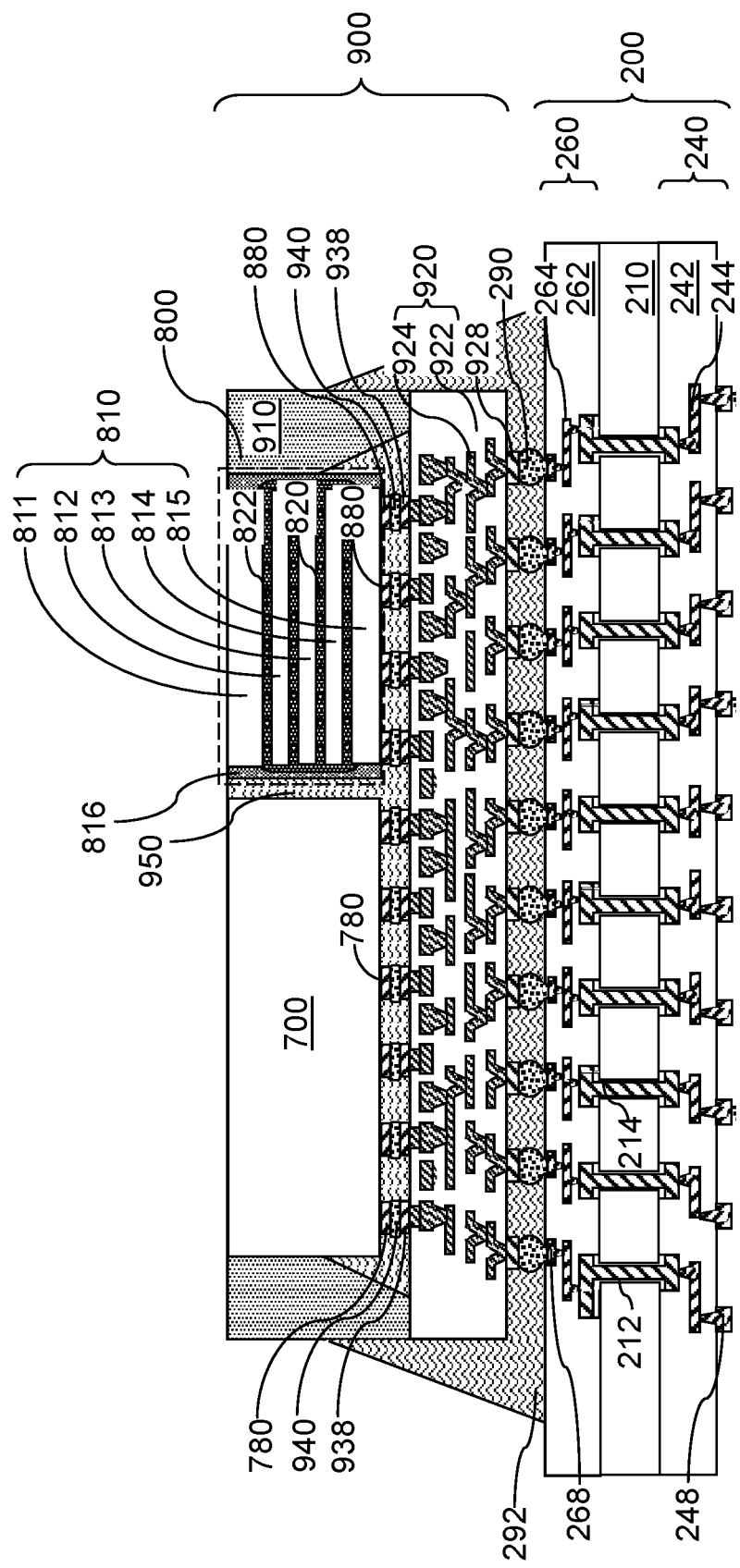
FIG. 12A is a vertical cross-sectional view of the exemplary structure after formation of a second underfill material portion according to an embodiment of the present disclosure.
Figure 12B:
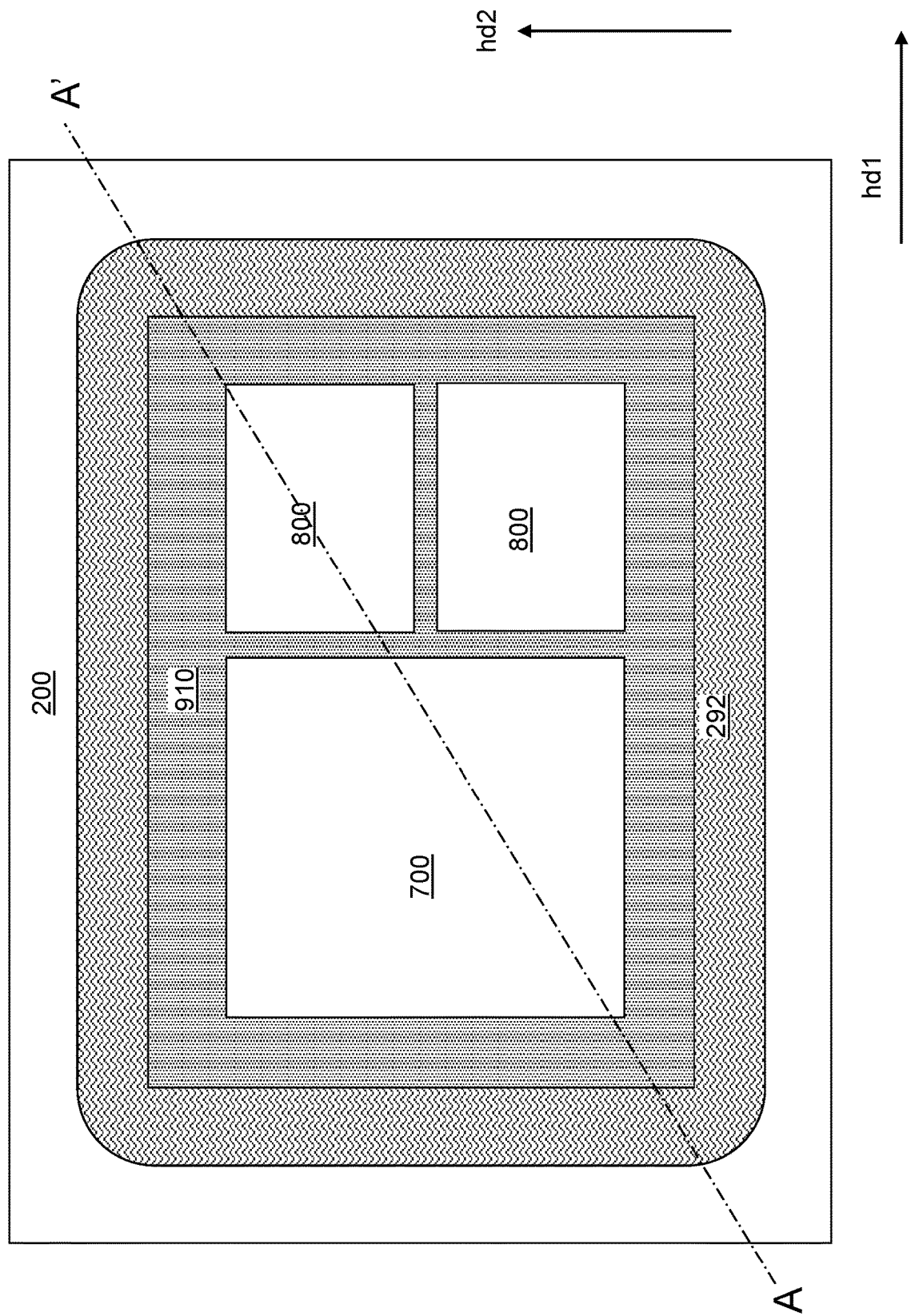
FIG. 12B is a top-down view of the exemplary structure of FIG. 12A. The vertical plane A-A' is the plane of the vertical cross-sectional view of FIG. 12A.

Referring to FIGS. 12A and 12B, a second underfill material portion 292 may be formed around the second solder material portions 290 by applying and shaping a second underfill material. The second underfill material portion 292 may be formed around the second solder material portions 290 by applying and shaping the second underfill material. The second underfill material portion 292 may be formed by injecting the second underfill material around the array of second solder material portions 290 after the second solder material portions 290 are reflowed. Any known underfill material application method may be used, which may be, for example, the capillary underfill method, the molded underfill method, or the printed underfill method.

The second underfill material portion 292 may be formed between the redistribution structure 920 and the package substrate 200. According to an aspect of the present disclosure, the second underfill material portion 292 may be formed directly on each sidewall of the molding compound die frame 910.

The second underfill material portion 292 may contact each of the second solder material portions 290 (which may be C4 solder balls or C2 solder caps), and may contact vertical sidewalls of the fan-out package 900. The second underfill material portion is formed between the redistribution structure 920 and the package substrate 200. The second underfill material portion laterally surrounds, and contacts, the array of second solder material portions 290 and the fan-out package 900.

In one embodiment, the second underfill material portion 292 may include tapered sidewalls that extend continuously from a respective sidewall of the molding compound die frame 910 to a planar surface (such as the top surface) of the package substrate 200. The taper angle of the tapered sidewalls may be in a range from 10 degrees to 80 degrees, such as from 30 degrees to 60 degrees, although lesser and greater taper angles may also be used. The taper angle may, or may not, be uniform. In one embodiment, the tapered sidewalls may have a same taper angle (as measured from a vertical direction) throughout.

Figure 13A:
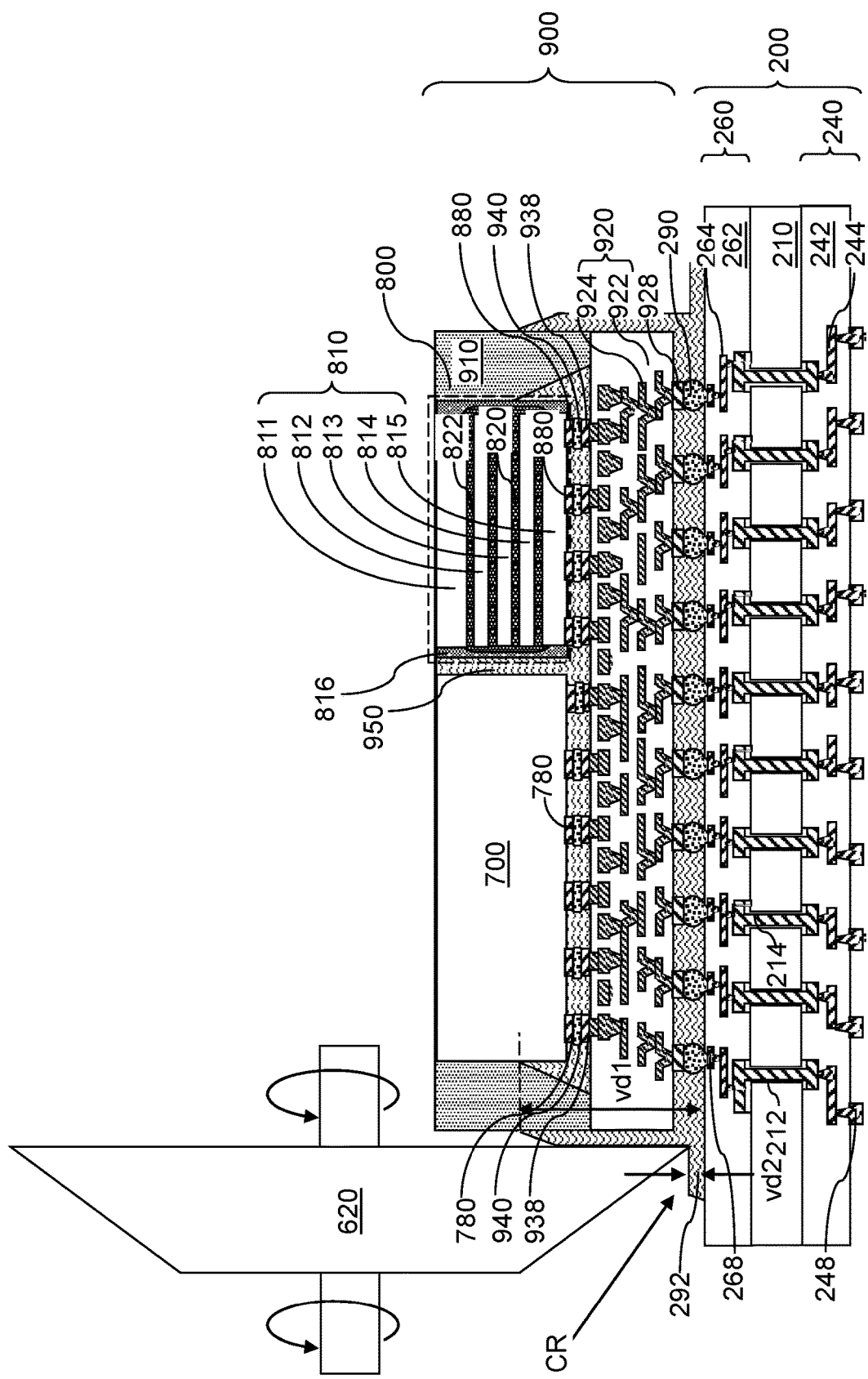
FIG. 13A is a vertical cross-sectional view of the exemplary structure during formation of cut regions using laser irradiation according to an embodiment of the present disclosure.
Figure 13B:
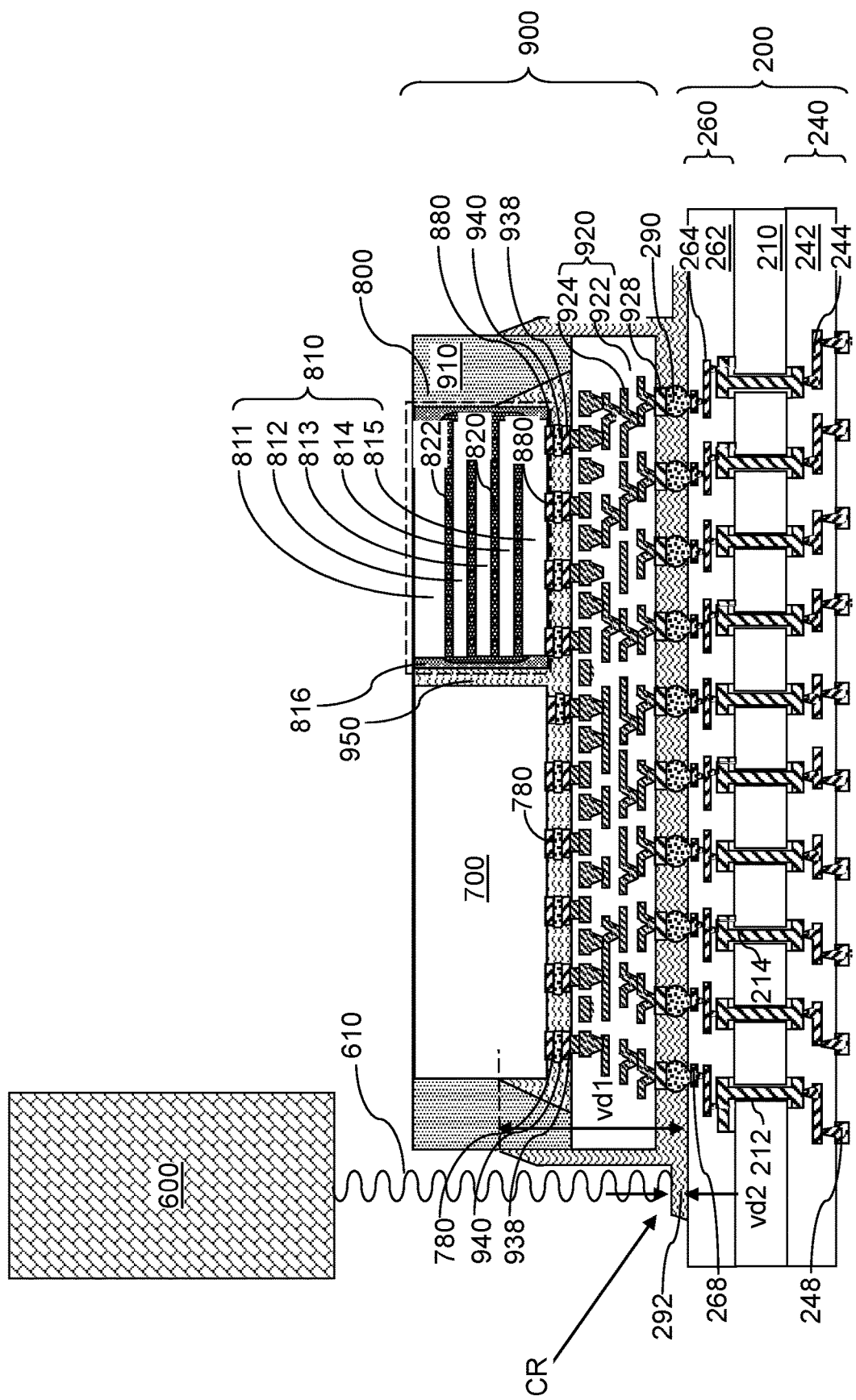
FIG. 13B is a vertical cross-sectional view of the exemplary structure during formation of cut regions using a milling apparatus according to an embodiment of the present disclosure.
Figure 13C:
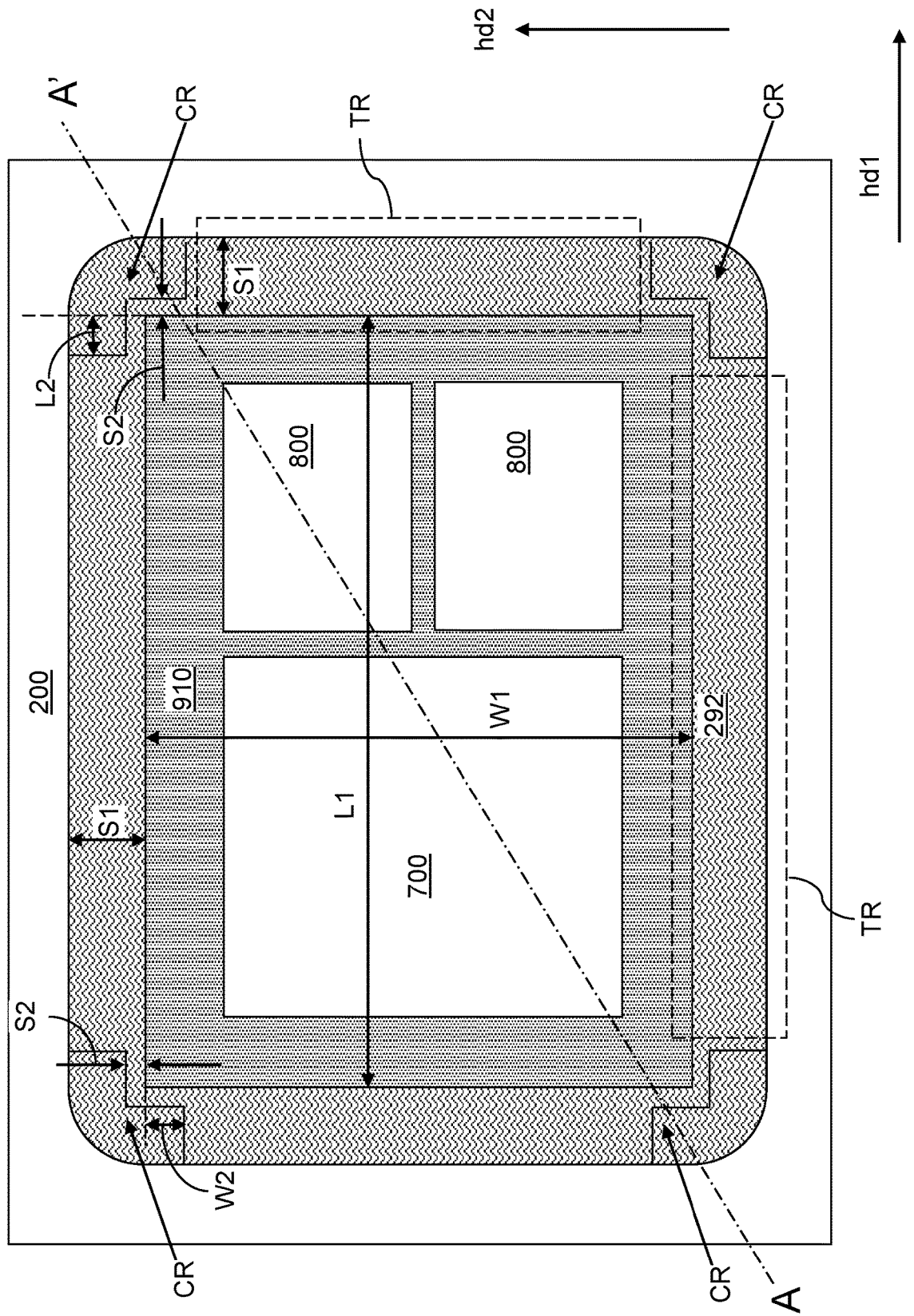
FIG. 13C is a top-down view of the exemplary structure of FIG. 13A or 13B after formation of the cut regions according to an embodiment of the present disclosure.

Referring to FIGS. 13A-13C, at least one cut region CR may be formed in the second underfill material portion 292 by cutting portions of the second underfill material portion 292. FIG. 13A illustrates an embodiment in which the removed sections of the second underfill material portion 292 may be cut by milling the removed sections of the second underfill material portion using a milling apparatus 620. The material of the second underfill material portion 292 in the removed sections may be milled by the milling apparatus. FIG. 13B illustrates an embodiment in which the removed sections of the second underfill material portion 292 may be cut by irradiating a laser beam 610 to each of the cut regions CR of the second underfill material portion 292. The material of the second underfill material portion 292 may be ablated by laser irradiation by the laser beam 610 that is emitted by a laser apparatus 600.

In one embodiment, the sections of the second underfill material portion 292 may be cut to provide at least one vertically-extending surface and a horizontally-extending surface within each of the cut regions CR. A plurality of vertically-extending surfaces that are adjoined to one another may be formed within one or more of the cut regions CR. In this embodiment, each of the at least one cut region CR of the second underfill material portion 292 may comprise a vertically-extending segment having a uniform lateral width and a horizontally-extending segment having a uniform vertical thickness and adjoined to a bottom end of the vertically-extending segment.

In one embodiment, at least one section in the second underfill material portion 292 may not be removed by the milling process and/or the laser irradiation process that forms the at least one cut region CR. In this embodiment, the second underfill material portion 292 includes at least one tapered region TR having a respective tapered sidewall after formation of the at least one cut region CR. In the example illustrated in FIG. 13C, four cut regions CR may be formed in corner regions of the second underfill material portion 292, and four tapered regions TR may be formed on sidewalls of the molding compound die frame 910. In this embodiment, the respective tapered sidewall comprises a respective upper edge that contacts a respective one of the sidewalls of the molding compound die frame 910.

In one embodiment, each of the at least one tapered region TR may be located outside an area bounded by the sidewalls of the molding compound die frame 910 in a plan view, and has a triangular vertical horizontal cross-sectional shape. In one embodiment, each of the at least one cut region CR may be laterally adjoined to a respective one of the at least one tapered region TR. In one embodiment, a triangular sidewall of the second underfill material portion 292 may be located at each boundary between a respective one of the at least one cut region CR and a respective one of the at least one tapered region TR.

Generally, the second underfill material portion 292 comprises a portion located inside vertical planes including the sidewalls of the fan-out package 900 and a portion located outside the vertical planes including the sidewalls of the fan-out package 900. The portion of the second underfill material portion 292 located inside the vertical planes including the sidewalls of the fan-out package 900 is herein referred to as an inter-substrate underfill portion. The inter-substrate underfill portion laterally surrounds the second solder material portions 290 and may be located within an outer periphery of the molding compound die frame 910 in a plan view, i.e., a view along a vertical direction that is perpendicular to the interface between the first underfill material portion 950 and the redistribution structure 920. The portion of the second underfill material portion 292 located outside the vertical planes including the sidewalls of the fan-out package 900 is herein referred to as a peripheral underfill portion. The peripheral underfill portion is located outside the outer periphery of the molding compound die frame 910 in the plan view, and comprises at least one cut region CR. Within each of the at least one cut region CR, a vertically-extending segment having a uniform lateral width and a horizontally-extending segment having a uniform vertical thickness and adjoined to a bottom end of the vertically-extending segment are located.

With reference to FIG. 13B, in one embodiment, the vertically-extending segment within each of the at least one cut region CR may have a maximum vertical extent within a vertical plane including an interface with a respective sidewall of the molding compound die frame 910. The maximum vertical extent is herein referred as a first vertical distance vd1. In one embodiment, the laterally-extending segment within each of the at least one cut region CR has a uniform vertical thickness, which is herein referred to as a second vertical distance vd2. The ratio of the uniform vertical thickness (i.e., the second vertical distance vd2) to the maximum vertical extent (i.e., the first vertical distance vd1) may be in a range from 0.01 to 0.1. In one embodiment, the first vertical distance vd1 may be in a range from 200 microns to 2 mm, such as from 400 microns to 1 mm, although lesser and greater vertical distances may also be used. In one embodiment, the second vertical distance may be in a range from 10 microns to 200 microns, such as from 20 microns to 100 microns, and/or from 40 microns to 70 microns, although lesser and greater vertical distances may also be used.

Figure 14A:
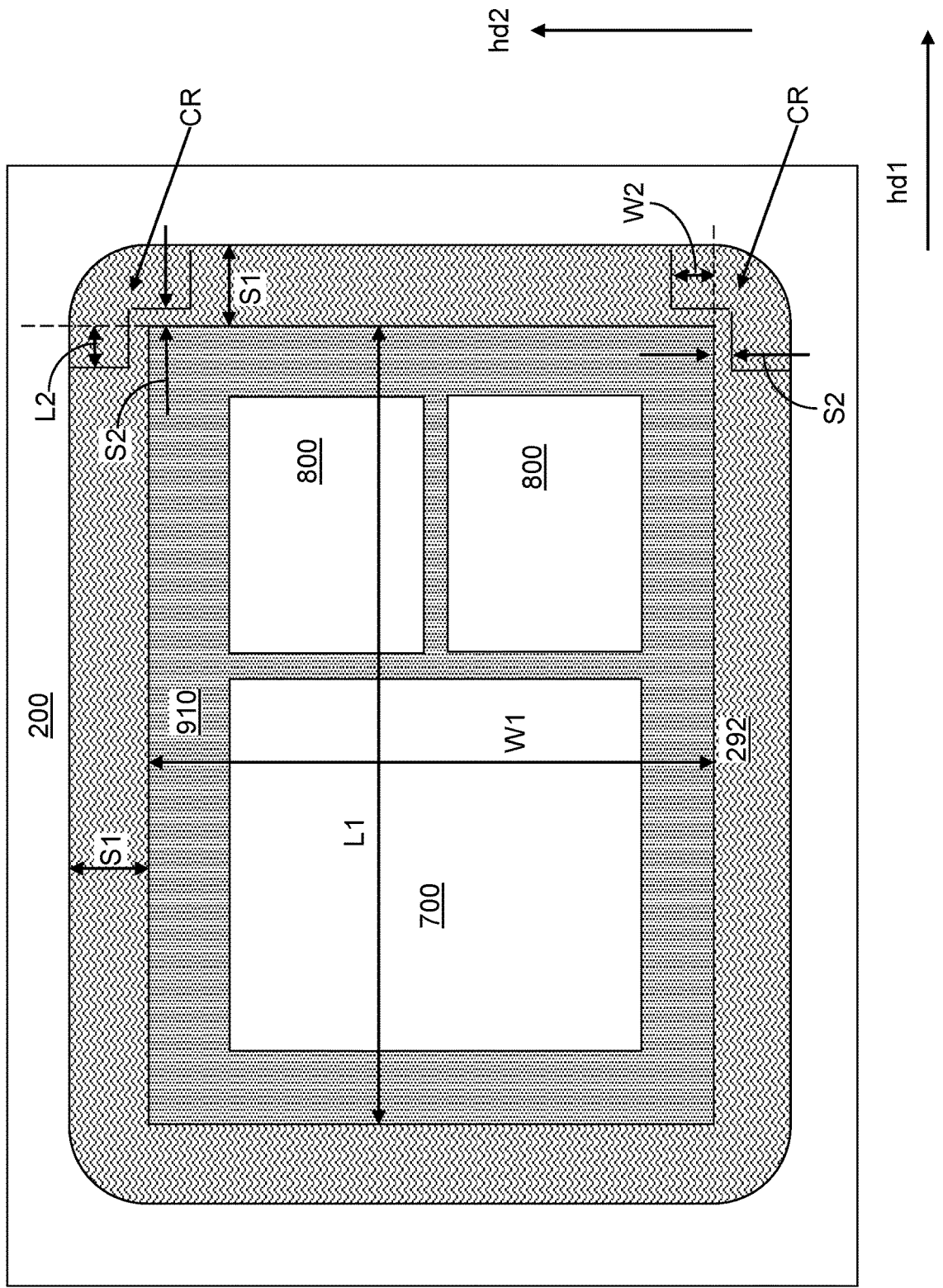
FIG. 14A is a top-down view of a first alternative embodiment of the exemplary structure after formation of cut regions according to an embodiment of the present disclosure.
Figure 14B:
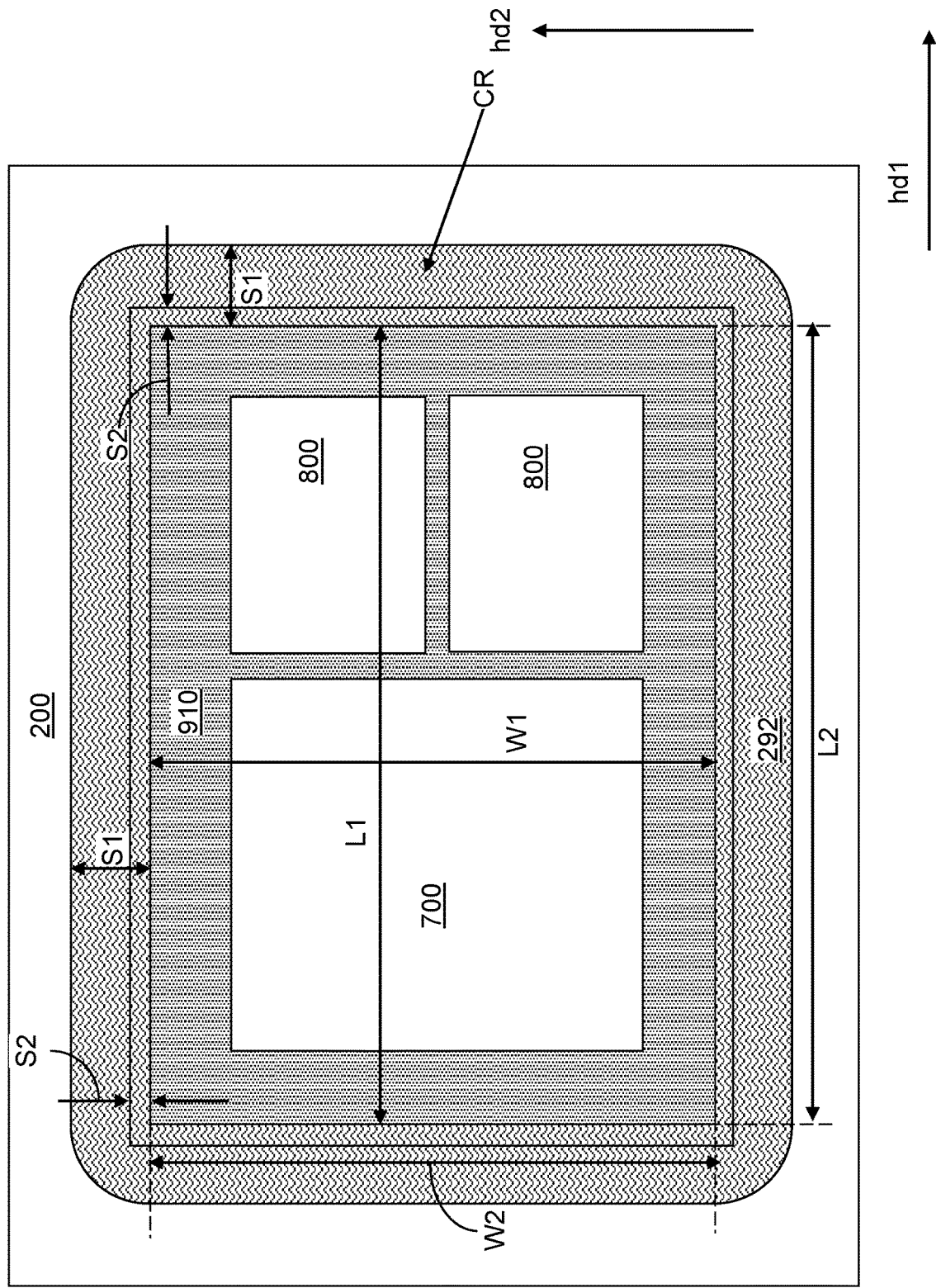
FIG. 14B is a top-down view of a second alternative embodiment of the exemplary structure after formation of cut regions according to an embodiment of the present disclosure.

With reference to FIGS. 13C, 14A and 14B, in various embodiments, the laterally-extending segment within each of the at least one cut region CR has a maximum lateral extent at a horizontal plane contacting the package substrate 200. The maximum lateral extent may be the lateral distance between a bottom edge of the laterally-extending segment and the vertical plane including the interface with a respective sidewall of the molding compound die frame 910. The maximum lateral extent is herein referred to as a first spacing S1. The uniform lateral width of the vertically-extending segment is herein referred to as a second spacing S2. In one embodiment, the ratio of the uniform lateral width (i.e., the second spacing S1) to the maximum lateral extent (i.e., the first spacing S1) may be in a range from 0.01 to 0.1. In one embodiment, the first spacing S1 may be in a range from 200 microns to 2 mm, such as from 400 microns to 1 mm, although lesser and greater vertical distances may also be used. In one embodiment, the second spacing S2 may be in a range from 10 microns to 200 microns, such as from 20 microns to 100 microns, and/or from 40 microns to 70 microns, although lesser and greater vertical distances may also be used.

In one embodiment, the molding compound die frame 910 may have a rectangular outer periphery in a plan view, and the at least one cut region CR comprises four cut regions CR located outside, and in proximity to, four corners of the rectangular outer periphery.

In one embodiment, the molding compound die frame 910 comprises a pair of lengthwise sidewalls laterally extending along a first horizontal direction hd1 and a pair of widthwise sidewalls laterally extending along a second horizontal direction hd2. The at least one cut region CR comprises four cut regions CR located outside, and in proximity to, four corners at which the pair of lengthwise sidewalls is adjoined to the pair of widthwise sidewalls. In one embodiment, the maximum lateral spacing among the four cut regions CR along the first horizontal direction hd1 may be less than the length of the pair of lengthwise sidewalls along the first horizontal direction hd1. In one embodiment, the maximum lateral spacing among the four cut regions CR along the second horizontal direction hd2 is less than a length of the pair of widthwise sidewalls along the second horizontal direction hd2.

In one embodiment, the molding compound die frame 910 may have a rectangular outer periphery having a first length L1 along a lengthwise direction such as a first horizontal direction and a first width W1 along a widthwise direction such as a second horizontal direction hd2. In one embodiment, one or more of the cut regions CR may have a void having an L-shaped horizontal cross-sectional shape including a segment that laterally extends along the first horizontal direction hd1 and a segment that laterally extends along the second horizontal direction hd2. The lateral distance of the segment of the void of a cut region CR that extends along the first horizontal direction hd1 as measured along the first horizontal direction hd1 between a vertical plane including a proximal widthwise sidewall of the molding compound die frame 910 and a vertical plane including an end of the void that adjoins a tapered region TR laterally extending along the first horizontal direction hd1 is herein referred to as a lengthwise cut distance, or a second length L2. The lateral distance of the segment of the void of a cut region CR that extends along the second horizontal direction hd2 as measured along the second horizontal direction hd2 between a vertical plane including a proximal lengthwise sidewall of the molding compound die frame 910 and a vertical plane including an end of the void that adjoins a tapered region TR laterally extending along the second horizontal direction hd2 is herein referred to as a widthwise cut distance, or a second width W2.

The first length L1 may be in a range from 0.5 mm to 30 mm, such as from 1 mm to 15 mm. The first width W1 may be in a range from 0.5 mm to 30 mm, such as from 1 mm to 15 mm. The ratio of the second length L2 to the first length L1 may be the same for each of the four cut regions CR, or may be different among the four cut regions CR. The ratio of the second length L2 to the first length L1 may be in a range from 0.005 to 0.9999, such as from 0.01 to 0.4. For example, the second length L2 may be in a range from 100 micron to 1 mm. The ratio of the second width W2 to the first width W1 may be the same for each of the four cut regions CR, or may be different among the four cut regions CR. The ratio of the second width W2 to the first width W1 may be in a range from 0.005 to 0.9999, such as from 0.01 to 0.4. For example, the second width W2 may be in a range from 100 micron to 1 mm.

In one embodiment, the peripheral underfill portion is adjoined to a periphery of the inter-substrate underfill portion, contacts sidewalls of the redistribution structure 920 and sidewalls of the molding compound die frame 910, and contacts a planar surface of the package substrate 200. The second underfill material portion 292 comprises at least one tapered region TR having a respective tapered sidewall that continuously extends from a respective sidewall of the molding compound die frame 910 to a planar surface of the package substrate 200. In one embodiment, each of the at least one tapered region TR comprises a vertical sidewall that contact the respective sidewall of the molding compound die frame 910 and a horizontal surface that contact the planar surface of the package substrate 200.

Referring to FIG. 14A, a first alternative configuration of the exemplary structure is illustrated, which may be derived from the exemplary structure of FIGS. 13A-13C by forming less than four cut regions CR. The total number of cut regions CR may be 1, 2, or 3. Each of the at least one cut region CR may be formed in proximity to a respective corner of the molding compound die frame 910. Each of the cut regions CR may be formed with any configuration described with reference to the exemplary structure of FIGS. 13A-13C.

Referring to FIG. 14B, a second alternative configuration of the exemplary structure is illustrated, which may be derived from the exemplary structure of FIGS. 13A-13C by increasing the second lengths L2 and the second widths W2 until all voids in the corner regions CR merge to form a continuous void that laterally surrounds the entire set of sidewalls of the molding compound die frame 910. In this embodiment, the at least one cut region DR comprises, and consists of, a single continuous cut region CR that encircles the molding compound die frame 910.

Figure 15:
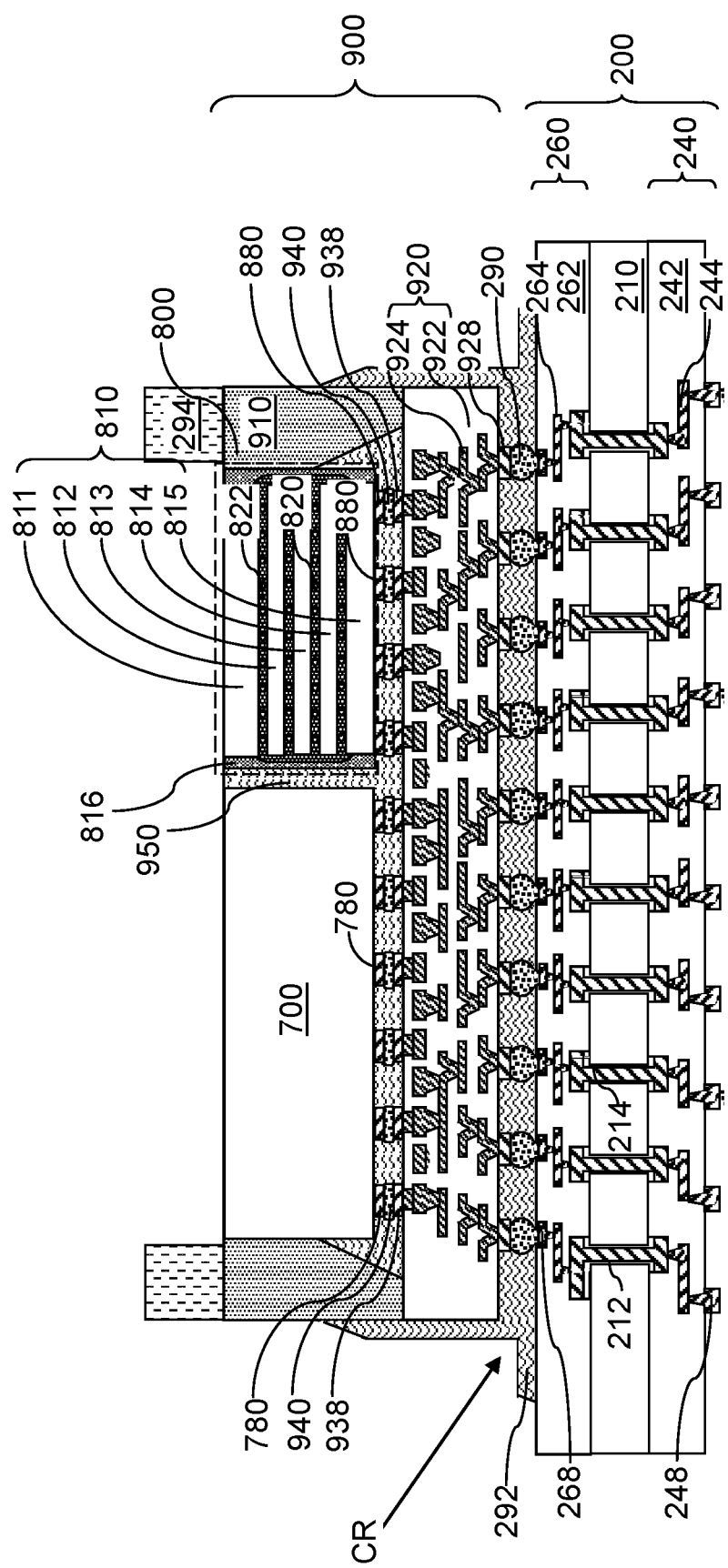
FIG. 15 is a vertical cross-sectional view of the exemplary structure after attaching the redistribution structure to a package substrate according to an embodiment of the present disclosure.

Referring to FIG. 15, a stabilization structure 294, such as a cap structure or a ring structure, may be attached to the assembly of the fan-out package 900 and the package substrate 200 to reduce deformation of the assembly during subsequent processing steps and/or during usage of the assembly.

Figure 16:
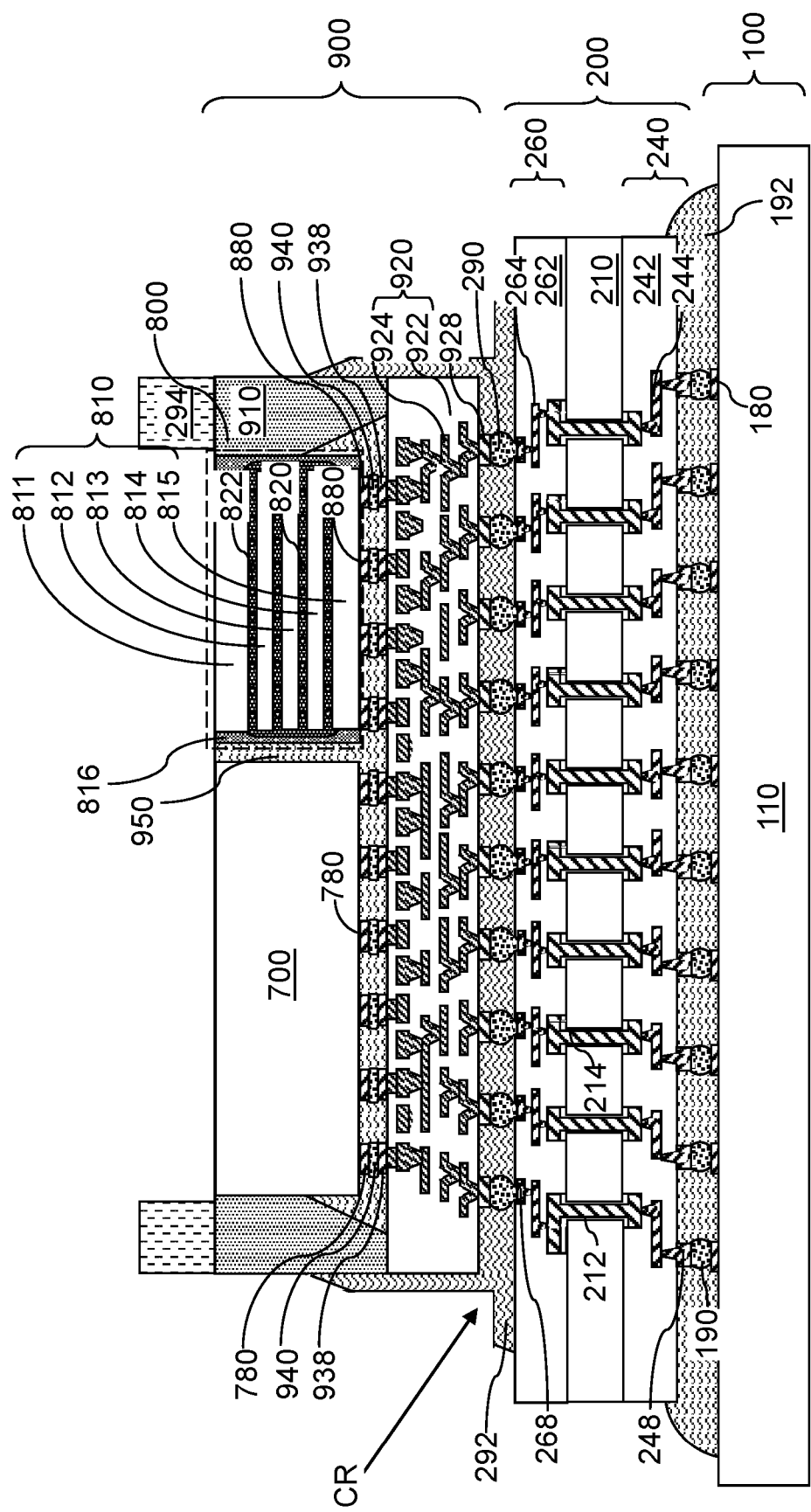
FIG. 16 is a vertical cross-sectional view of the exemplary structure after the package substrate is attached to a printed circuit board (PCB) according to an embodiment of the present disclosure.

Referring to FIG. 16, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The package substrate 200 is attached to the PCB 100 through the array of solder joints 190.

Figure 17:
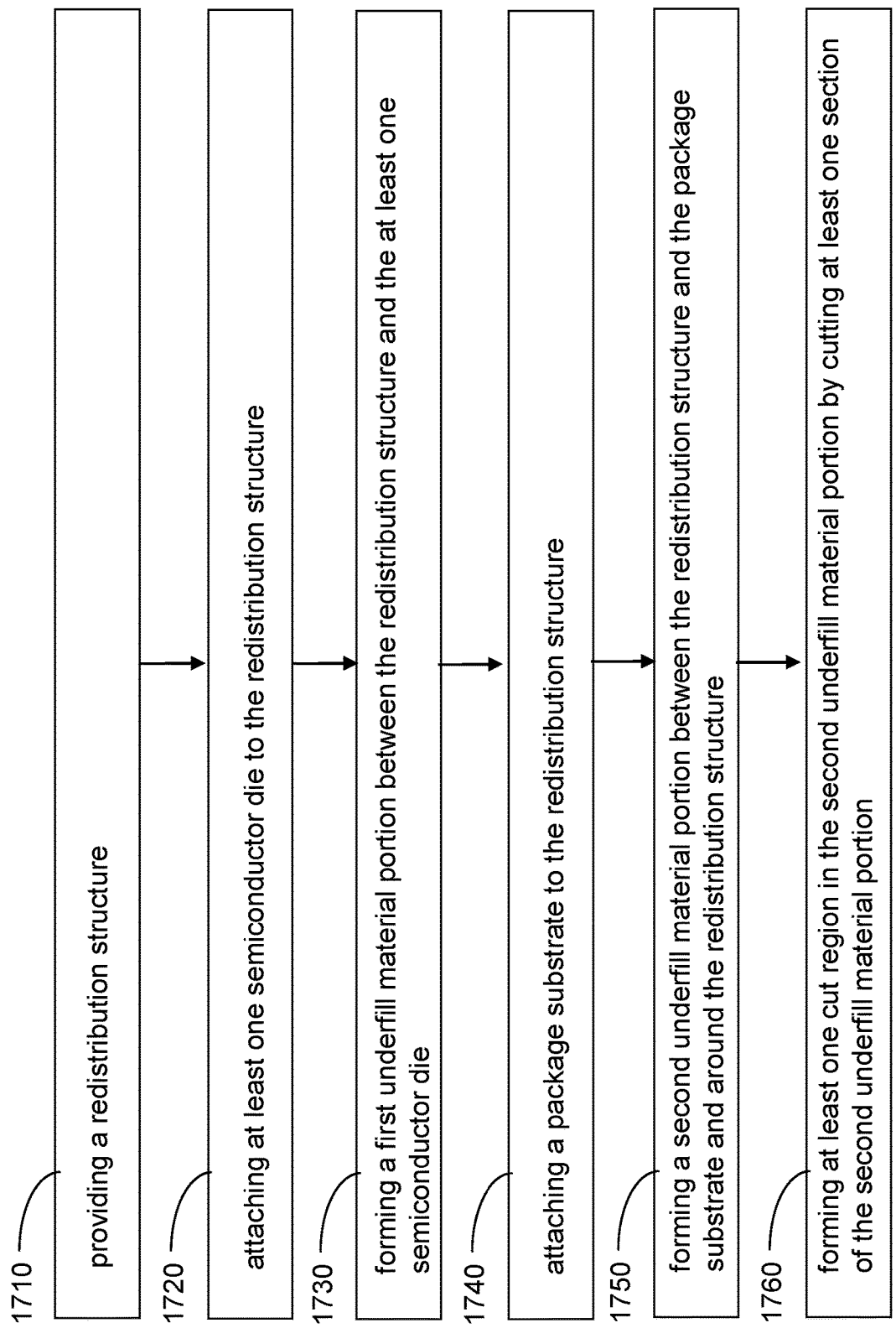
FIG. 17 is a flowchart illustrating steps for forming an exemplary structure according to an embodiment of the present disclosure.

Referring to FIG. 17, a flowchart illustrates steps for forming an exemplary structure according to an embodiment of the present disclosure.

Referring to step 1710 and FIGS. 1A, 1B, 2A, and 2B, a redistribution structure 920 may be provided.

Referring to step 1720 and FIGS. 3A-3C, at least one semiconductor die (700, 800) may be attached to the redistribution structure 920 using first solder material portions 940.

Referring to step 1730 and FIG. 4, a first underfill material portion 950 may be formed around the first solder material portions 940.

Referring to step 1740 and FIGS. 5A-11, a package substrate 200 may be attached to the redistribution structure 920 using second solder material portions 290.

Referring to step 1750 and FIGS. 12A and 12B, a second underfill material portion 292 may be formed around the second solder material portions 290 and around the redistribution structure 920.

Referring to step 1760 and FIGS. 13A-16, at least one cut region CR may be formed in the second underfill material portion 292 by cutting at least one section of the second underfill material portion 292.

Referring to all drawings and according to various embodiments of the present disclosure, a chip package structure is provided, which may include: at least one semiconductor die (700, 800) attached to a redistribution structure 920 through solder material portions 940; a first underfill material portion 950 located between the redistribution structure 920 and the at least one semiconductor die (700, 800) and laterally surrounding a portion of the at least one semiconductor die (700, 800); a molding compound die frame 910 laterally surrounding at least one semiconductor die (700, 800); and a second underfill material portion 292 contacting sidewalls of the redistribution structure 920 and sidewalls of the molding compound die frame 910 and may include at least one cut region CR, wherein the second underfill material portion 292 may include a vertically-extending segment having a uniform lateral width (such as the second spacing S2) and a horizontally-extending segment having a uniform vertical thickness (such as the second vertical distance vd2) and adjoined to a bottom end of the vertically-extending segment within each of the at least one cut region CR.

In one embodiment, the second underfill material portion 292 may include at least one tapered region TR having a respective tapered sidewall. In one embodiment, the respective tapered sidewall may include a respective upper edge that contacts a respective one of the sidewalls of the molding compound die frame 910. In one embodiment, each of the at least one tapered region TR is located outside an area bounded by the sidewalls of the molding compound die frame 910 in a plan view, and has a triangular vertical horizontal cross-sectional shape.

In one embodiment, each of the at least one cut region CR may be laterally adjoined to a respective one of the at least one tapered region TR. In one embodiment, a triangular sidewall of the second underfill material portion 292 may be located at each boundary between a respective one of the at least one cut region CR and a respective one of the at least one tapered region TR.

In one embodiment, the vertically-extending segment within each of the at least one cut region CR has a maximum vertical extent (such as the first vertical distance vd1) within a vertical plane including an interface with a respective sidewall of the molding compound die frame 910. The laterally-extending segment within each of the at least one cut region CR has a maximum lateral extent (such as the first spacing S1) at a horizontal plane contacting a package substrate 200. The maximum lateral extent may be a distance between a bottom edge of the laterally-extending segment and the vertical plane including the interface with a respective sidewall of the molding compound die frame 910. The ratio of the uniform lateral width (such as the second spacing S2) to the maximum lateral extent (such as the first spacing S1) may be in a range from 0.01 to 0.1. The ratio of the uniform vertical thickness (such as the second vertical distance vd2) to the maximum vertical extent (such as the first vertical distance vd1) is in a range from 0.01 to 0.1.

In one embodiment, the molding compound die frame 910 has a rectangular outer periphery in a plan view; and the at least one cut region CR may include four cut regions CR located outside, and in proximity to, four corners of the rectangular outer periphery.

In one embodiment, the molding compound die frame 910 may include a pair of lengthwise sidewalls laterally extending along a first horizontal direction hd1 and a pair of widthwise sidewalls laterally extending along a second horizontal direction hd2. In one embodiment, the at least one cut region CR may include four cut regions CR located outside, and in proximity to, four corners at which the pair of lengthwise sidewalls is adjoined to the pair of widthwise sidewalls. In one embodiment, the maximum lateral spacing among the four cut regions CR along the first horizontal direction hd1 is less than a length of the pair of lengthwise sidewalls along the first horizontal direction hd1. In one embodiment, the maximum lateral spacing among the four cut regions CR along the second horizontal direction hd2 may be less than a length of the pair of widthwise sidewalls along the second horizontal direction hd2.

In one embodiment, the at least one cut region CR may include a single continuous cut region CR that encircles the molding compound die frame 910.

According to another aspect of the present disclosure, a chip package structure is provided, which may include: at least one semiconductor die (700, 800) attached to a redistribution structure 920; a first underfill material portion 950 laterally surrounding a portion of the at least one semiconductor die (700, 800); a molding compound die frame 910 laterally surrounding at least one semiconductor die (700, 800); a package substrate 200 attached to the redistribution structure 920; and a second underfill material portion 292 which may include: an inter-substrate underfill portion laterally surrounding the redistribution structure 920 and located within an outer periphery of the molding compound 910 in a plan view, and a peripheral underfill portion located outside the outer periphery of the molding compound 910 in the plan view and comprising at least one cut region having an L-shaped vertical cross-sectional shape, wherein each of the at least one cut region CR has a vertically-extending portion having a uniform lateral width (such as the second spacing S2) and a horizontally-extending portion. In one embodiment, a vertically-extending segment having a uniform lateral width (such as the second spacing S2) and/or a horizontally-extending segment having a uniform vertical thickness (such as the second vertical distance vd2) and adjoined to a bottom end of the vertically-extending segment are present in each of at least one cut region CR.

In one embodiment, the peripheral underfill portion may be adjoined to a periphery of the inter-substrate underfill portion, contacts sidewalls of the redistribution structure 920 and sidewalls of the molding compound die frame 910, and contacts a planar surface of the package substrate 200.

In one embodiment, the second underfill material portion 292 may include at least one tapered region TR having a respective tapered sidewall that continuously extends from a respective sidewall of the molding compound die frame 910 to a planar surface of the package substrate 200.

In one embodiment, each of the at least one tapered region TR may include a vertical sidewall that contact the respective sidewall of the molding compound die frame 910 and a horizontal surface that contact the planar surface of the package substrate 200.

In one embodiment, the at least one cut region CR may include a single continuous cut region CR that encircles the molding compound die frame 910.

The various structures and methods of the present disclosure may be used to provide a chip package structure including a fan-out package 900 including at least one cut region CR, which reduces mechanical coupling between the fan-out package 900 and the package substrate 200, and reduces distortion of the fan-out package 900 under mechanical and/or thermal stress. The chip package structure of the present disclosure provides a configuration that avoids formation of a stress concentration points from which cracks in a molding compound material portion may initiate under mechanical stress during handling of the chip package structure or during use of a device including the chip package structure. The various methods and structures of the present disclosure may be used to reduce deformation of a fan-out package 900 and to increase the reliability of the fan-out package 900.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
at least one semiconductor die attached to a redistribution structure;
a first underfill material portion located between the redistribution structure and the at least one semiconductor die and laterally surrounding a portion of the at least one semiconductor die;
a molding compound laterally surrounding at least one semiconductor die; and
a second underfill material portion contacting sidewalls of the redistribution structure and sidewalls of the molding compound and comprising at least one cut region, wherein the second underfill material portion comprises a vertically-extending portion having a uniform lateral width and a horizontally-extending portion having a uniform vertical thickness and adjoined to a bottom end of the vertically-extending portion within each of the at least one cut region, wherein:
the molding compound has a rectangular outer periphery in a plan view; and
the at least one cut region comprises four cut regions located outside, and in proximity to, four corners of the rectangular outer periphery.

2. The chip package structure of claim 1, wherein the second underfill material portion comprises at least one tapered region having a respective tapered sidewall.

3. The chip package structure of claim 2, wherein the respective tapered sidewall comprises a respective upper edge that contacts a respective one of the sidewalls of the molding compound.

4. The chip package structure of claim 2, wherein each of the at least one tapered region is located outside an area bounded by the sidewalls of the molding compound in a plan view, and has a triangular vertical horizontal cross-sectional shape.

5. The chip package structure of claim 4, wherein each of the at least one cut region is laterally adjoined to a respective one of the at least one tapered region.

6. The chip package structure of claim 4, wherein a triangular sidewall of the second underfill material portion is located at each boundary between a respective one of the at least one cut region and a respective one of the at least one tapered region.

7. The chip package structure of claim 1, wherein:
the vertically-extending segment within each of the at least one cut region has a maximum vertical extent within a vertical plane including an interface with a respective sidewall of the molding compound;
the laterally-extending segment within each of the at least one cut region has a maximum lateral extent at a horizontal plane contacting a package substrate;
a ratio of the uniform lateral width to the maximum lateral extent is in a range from 0.01 to 0.1; and
a ratio of the uniform vertical thickness to the maximum vertical extent is in a range from 0.01 to 0.1.

8. The chip package structure of claim 1, wherein:
the molding compound comprises a pair of lengthwise sidewalls laterally extending along a first horizontal direction and a pair of widthwise sidewalls laterally extending along a second horizontal direction;
the at least one cut region comprises four cut regions located outside, and in proximity to, four corners at which the pair of lengthwise sidewalls is adjoined to the pair of widthwise sidewalls;
a maximum lateral spacing among the four cut regions along the first horizontal direction is less than a length of the pair of lengthwise sidewalls along the first horizontal direction; and
a maximum lateral spacing among the four cut regions among the second horizontal direction is less than a length of the pair of widthwise sidewalls along the second horizontal direction.

9. The chip package structure of claim 1, wherein the at least one cut region comprises a single continuous cut region that encircles the molding compound.

10. The chip package structure of claim 1, wherein each sidewall of the molding compound comprises:
a respective lower surface segment that contacts a respective vertically-extending portion of the second underfill material portion; and
a respective upper surface segment that is not in contact with the second underfill material portion.

11. A chip package structure, comprising:
at least one semiconductor die attached to a redistribution structure;
a first underfill material portion laterally surrounding a portion of the at least one semiconductor die;
a molding compound laterally surrounding at least one semiconductor die;
a package substrate attached to the redistribution structure; and
a second underfill material portion comprising:
an inter-substrate underfill portion laterally surrounding the redistribution structure and located within an outer periphery of the molding compound in a plan view, and
a peripheral material portion located outside the outer periphery of the molding compound in the plan view and comprising at least one cut region having an L-shaped vertical cross-sectional shape, wherein each of the at least one cut region has a vertically-extending portion having a uniform lateral width and a horizontally-extending portion wherein:
the molding compound has a rectangular outer periphery in the plan view; and
the at least one cut region comprises four cut regions located outside, and in proximity to, four corners of the rectangular outer periphery.

12. The chip package structure of claim 11, wherein the peripheral material portion is adjoined to a periphery of the inter-substrate underfill portion, contacts sidewalls of the redistribution structure and sidewalls of the molding compound, and contacts a planar surface of the package substrate.

13. The chip package structure of claim 11, wherein the second underfill material portion comprises at least one tapered region having a respective tapered sidewall that continuously extends from a respective sidewall of the molding compound to a planar surface of the package substrate.

14. The chip package structure of claim 13, wherein each of the at least one tapered region comprises a vertical sidewall that contact the respective sidewall of the molding compound and a horizontal surface that contact the planar surface of the package substrate.

15. The chip package structure of claim 11, wherein the at least one cut region comprises a single continuous cut region that encircles the molding compound.

16. A method of forming a chip package structure, comprising:
providing a redistribution structure;
attaching at least one semiconductor die to the redistribution structure;
forming a first underfill material portion between the redistribution structure and the at least one semiconductor die;
attaching a package substrate to the redistribution structure;
forming a second underfill material portion between the redistribution structure and the package substrate and around the redistribution structure; and
forming at least one cut region in the second underfill material portion by cutting portions of the second underfill material portion,
wherein the portions of the second underfill material portion are cut by performing a processing step selected from a first processing step or a second processing step,
the first processing step comprising irradiating a laser beam to each of the cut regions of the second underfill material portion, whereby a material of the second underfill material portion is ablated by laser irradiation by the laser beam, and
the second processing step comprising milling the portions of the second underfill material portion using a milling apparatus, whereby a material of the second underfill material portion is milled by the milling apparatus.

17. The method of claim 16, wherein the portions of the second underfill material portion are cut to provide at least one vertically-extending surface and a horizontally-extending surface within each of the cut regions.

18. The method of claim 16, wherein:
the method comprises forming a molding compound around the first underfill material portion and the at least one semiconductor die;
the second underfill material portion comprises tapered sidewalls that extend continuously from a respective sidewall of the molding compound to a planar surface of the package substrate before formation of the at least one cut region; and
each of the at least one cut region of the second underfill material portion comprises a vertically-extending portion having a uniform lateral width and a horizontally-extending portion having a uniform vertical thickness and adjoined to a bottom end of the vertically-extending portion.

19. The method of claim 16, wherein the portions of the second underfill material portion are cut by performing the first processing step.

20. The method of claim 16, wherein the portions of the second underfill material portion are cut by performing the second processing step.

* * * * *